US012283322B2

(12) United States Patent
Wu et al.

(10) Patent No.: US 12,283,322 B2
(45) Date of Patent: Apr. 22, 2025

(54) THREE-DIMENSIONAL NAND MEMORY AND FABRICATION METHOD THEREOF

(71) Applicant: Yangtze Memory Technologies Co., Ltd., Hubei (CN)

(72) Inventors: Linchun Wu, Hubei (CN); Kun Zhang, Hubei (CN); Wenxi Zhou, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 386 days.

(21) Appl. No.: 17/705,983

(22) Filed: Mar. 28, 2022

(65) Prior Publication Data

US 2022/0310162 A1    Sep. 29, 2022

Related U.S. Application Data

(63) Continuation of application No. PCT/CN2021/114742, filed on Aug. 26, 2021.

(30) Foreign Application Priority Data

Mar. 23, 2021 (CN) .......................... 202110306440.X

(51) Int. Cl.
G11C 16/04    (2006.01)
H01L 23/522    (2006.01)
(Continued)

(52) U.S. Cl.
CPC ...... *G11C 16/0483* (2013.01); *H01L 23/5226* (2013.01); *H01L 23/5283* (2013.01);
(Continued)

(58) Field of Classification Search
CPC ......... H01L 24/80; H01L 25/50; H01L 24/08; H01L 25/18; H01L 23/5283;
(Continued)

(56) References Cited

U.S. PATENT DOCUMENTS

| 10,629,616 B1 | 4/2020 | Kai et al. |
|---|---|---|
| 2007/0202647 A1 | 8/2007 | Mariani et al. |

(Continued)

FOREIGN PATENT DOCUMENTS

| CN | 109712977 A | 5/2019 |
|---|---|---|
| CN | 110088905 A | 8/2019 |

(Continued)

OTHER PUBLICATIONS

International Search Report of the International Searching Authority directed to related International Patent Application No. PCT/CN2021/114742, mailed Dec. 22, 2021; 5 pages.

(Continued)

*Primary Examiner* — Mouloucoulaye Inoussa
(74) *Attorney, Agent, or Firm* — HANLEY, FLIGHT & ZIMMERMAN, LLC

(57) ABSTRACT

The present disclosure provides a method for forming a three-dimensional (3D) memory device. The method includes disposing an alternating dielectric stack over a substrate, wherein the alternating dielectric stack includes first dielectric layers and second dielectric layers alternatingly stacked on the substrate. The method also includes forming a channel structure penetrating through the alternating dielectric stack and extending into the substrate, wherein the channel structure includes a channel layer disposed on a sidewall of a memory film. The method further includes removing the substrate and a portion of the memory film that extends into the substrate to expose a portion of the channel layer; and disposing an array common source (ACS) on the exposed portion of the channel layer.

23 Claims, 21 Drawing Sheets

(51) Int. Cl.
*H01L 23/528* (2006.01)
*H10B 41/10* (2023.01)
*H10B 41/27* (2023.01)
*H10B 41/35* (2023.01)
*H10B 43/10* (2023.01)
*H10B 43/27* (2023.01)
*H10B 43/35* (2023.01)

(52) U.S. Cl.
CPC ............ *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search
CPC . H01L 23/585; H01L 23/562; H01L 29/1037; H01L 21/823475; H01L 23/528; H01L 27/0688; H01L 21/8221; H01L 21/76805; H01L 21/76877; H01L 23/5226; H01L 23/3192; H01L 23/522; H01L 21/761; H01L 27/1207; H01L 23/53295; H01L 23/535; H01L 2224/08058; H01L 2224/80896; H01L 2224/08145; H01L 2224/80895; H01L 2224/09517; H01L 2224/80894; H01L 2225/06575; H01L 2225/06562; H01L 2225/06568; H01L 2225/06582; H01L 2225/06527; H01L 2924/0002; H01L 21/76264; H01L 2224/8083; H01L 2224/8089; H01L 2924/14511; H01L 2224/05647; H01L 2924/1431; H01L 2924/00014; H01L 2224/9202; H01L 2224/08121; H01L 2224/04042; H01L 2225/06524; H01L 2224/80001; H01L 2224/03; H10B 43/27; H10B 43/35; H10B 43/40; H10B 43/50; H10B 41/50; H10B 41/35; H10B 41/40; H10B 41/10; H10B 41/27; H10B 43/10; H10B 43/30; H10B 20/50; H10B 63/84; H10B 63/34; G11C 16/3459; G11C 16/0483; G11C 16/10
See application file for complete search history.

(56) References Cited

U.S. PATENT DOCUMENTS

| | | | |
|---|---|---|---|
| 2018/0122906 A1 | 5/2018 | Yu | |
| 2018/0238195 A1* | 8/2018 | Nguyen | F16M 13/04 |
| 2018/0350879 A1 | 12/2018 | Sel et al. | |
| 2018/0374866 A1 | 12/2018 | Makala et al. | |
| 2020/0258816 A1* | 8/2020 | Okina | H10B 43/40 |
| 2020/0258817 A1* | 8/2020 | Okina | H10B 43/40 |
| 2021/0035965 A1* | 2/2021 | Mizutani | H01L 25/18 |
| 2021/0202458 A1* | 7/2021 | Jung | H10B 43/27 |
| 2021/0320094 A1* | 10/2021 | Zhang | H01L 24/80 |
| 2021/0320118 A1* | 10/2021 | Zhang | H01L 25/18 |
| 2021/0375828 A1* | 12/2021 | Zhang | H01L 24/80 |
| 2021/0375900 A1* | 12/2021 | Zhang | H10B 43/27 |
| 2021/0375912 A1* | 12/2021 | Zhang | H10B 43/40 |
| 2021/0375913 A1* | 12/2021 | Zhang | H10B 43/35 |
| 2021/0375914 A1* | 12/2021 | Zhang | H10B 43/40 |
| 2021/0375915 A1* | 12/2021 | Zhang | H10B 41/40 |
| 2021/0375916 A1* | 12/2021 | Zhang | H10B 43/27 |
| 2021/0391315 A1* | 12/2021 | Zhang | H01L 25/18 |
| 2022/0108994 A1* | 4/2022 | Lee | H10B 41/27 |

FOREIGN PATENT DOCUMENTS

| | | |
|---|---|---|
| CN | 111403401 A | 7/2020 |
| CN | 111540746 A | 8/2020 |
| CN | 111566815 A | 8/2020 |
| CN | 111801798 A | 10/2020 |
| CN | 111801800 A | 10/2020 |
| CN | 112185980 A | 1/2021 |
| CN | 112420725 A | 2/2021 |
| CN | 112951841 A | 6/2021 |
| JP | 2017147465 A | 8/2017 |
| JP | 2022538954 A | 9/2022 |

OTHER PUBLICATIONS

International Searching Authority, "Written Opinion of the International Searching Authority," issued in connection with International Patent Application No. PCT/CN2021/114742, mailed on Dec. 22, 2021, 4 pages.

International Searching Authority, "International Preliminary Report on Patentability," issued in connection with International Patent Application No. PCT/CN2021/114742, mailed on Sep. 12, 2023, 5 pages.

Japanese Patent Office, "Notice of Reasons for Refusal," issued in connection with Japanese Patent Application No. 2023-557781, mailed on Aug. 26, 2024, 15 pages. [English language machine translation included.].

Japanese Patent Office, "Search Report by Registered Search Organization," issued in connection with Japanese Patent Application No. 2023-557781, mailed on Aug. 30, 2024, 51 pages. [English language machine translation included.].

The State Intellectual Property Office of the People's Republic of China, "First Office Action," issued in connection with Chinese Patent Application No. 202210046764.9, mailed on Oct. 29, 2024, 11 pages. [English language machine translation included.].

European Patent Office, "Extended European Search Report," issued in connection with European Patent Application No. 21932530.5-1211, mailed on Sep. 17, 2024, 8 pages.

Korean Patent Office, "Request for the Submission of an Opinion," issued in connection with Korean Patent Application No. 10-2023-7031418, mailed on Nov. 25, 2024, 21 pages. [English language machine translation included.].

Korean Intellectual Property Office, "Written Opinion," issued in connection with Korean Patent Application No. 10-2023-7031418, mailed on Jan. 23, 2025, 9 pages. [English language machine translation included.].

Japanese Patent Office, "Notice of Refusal," issued in connection with Japanese Patent Application No. 2023-557781, mailed on Mar. 4, 2025, 6 pages. [English language machine translation included.].

* cited by examiner

THREE-DIMENSIONAL NAND MEMORY AND FABRICATION METHOD THEREOF

CROSS-REFERENCE TO RELATED APPLICATIONS AND INCORPORATION BY REFERENCE

This application claims priority to PCT/CN2021/114742 filed on Aug. 26, 2021, which claims priority to Chinese Patent Application No. 202110306440.X filed on Mar. 23, 2021, all of which are incorporated herein by reference in their entirety.

TECHNICAL FIELD

The present disclosure generally relates to the field of semiconductor technology, and more particularly, to a three-dimensional NAND flash memory and its fabrication methods.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. The number of vertically stacked layers can be greatly increased to further increase the storage capacity. However, a high aspect ratio structure can be very challenging to fabricate. For example, channel holes are etched through the stacked structure, where memory films and channel layers can be disposed on sidewalls of the channel holes. To form source contact to the channel layers, memory films at the bottom of the channel holes need to be removed. However, removing memory films from the bottom of the channel holes without damaging the channel layers on the sidewalls is problematic. Pin holes in the channel layers can cause reliability issues and lower product yield. Therefore, a need exists to provide a method for forming source contacts to the channel layers.

BRIEF SUMMARY

Embodiments of a three-dimensional (3D) memory device and a method for forming the same are described in the present disclosure.

One aspect of the present disclosure provides a method for forming a three-dimensional (3D) memory device. The method includes forming, sequentially on a substrate, a first etch-stop layer, a second etch-stop layer and an alternating dielectric stack; forming channel holes penetrating through the alternating dielectric stack and extending into the substrate; disposing memory films and then channel layers on sidewalls of the channel holes to form channel structures; removing the substrate and stopping on the first etch-stop layer to expose portions of the memory films that extend into the substrate; removing the first etch-stop layer and the exposed portions of the memory films, and stopping on the second etch-stop layer, to expose portions of the channel layers that extend into the substrate; and forming an array common source (ACS) on a backside of the second etch-stop layer farther away from the alternating dielectric stack to cover the exposed portions of the channel layers.

In some embodiments, the first etch-stop layer includes silicon oxide and the second etch-stop layer includes polycrystalline silicon.

In some embodiments, the substrate includes a handle wafer, an insulator layer (e.g., a sacrificial silicon oxide layer) and a semiconductor layer (e.g., a sacrificial polycrystalline silicon layer).

In some embodiments, the removing the substrate and stopping on the first etch-stop layer includes removing the substrate by a wet etch.

In some embodiments, the removing the first etch-stop layer and the exposed portions of the memory films includes removing the first etch-stop layer and the exposed portions of the memory films by a wet etch.

In some embodiments, the alternating dielectric stack includes a staircase region, and the method also includes forming dummy channel holes in the staircase region, wherein the dummy channel holes penetrate through at least a portion of the alternating dielectric stack and extend into the substrate.

In some embodiments, the alternating dielectric stack includes alternatingly stacked first dielectric layers and second dielectric layers (i.e. sacrificial layers). The method also includes forming slit openings penetrating through the alternating dielectric stack and extending into the substrate, wherein the slit openings is distant from the channel structures; removing the sacrificial layers through the slit openings to form lateral tunnels; forming conductive layers inside the lateral tunnels; and disposing insulating material inside the slit openings to form slit structures.

In some embodiments, the forming the conductive layers inside the lateral tunnels includes disposing a gate dielectric layer on sidewalls of the lateral tunnels and the slit openings; and disposing a gate adhesion layer on the gate dielectric layer inside the lateral tunnels.

In some embodiments, the substrate further includes a peripheral region covered by an insulating layer. The method also includes forming, in the peripheral region, a through-silicon-via (TSV) penetrating through the front insulating layer and extending into the substrate.

In some embodiments, the forming the TSV includes forming a TSV interface layer covering sidewalls of the TSV.

In some embodiments, the method also includes removing, sequentially through a wet etch process, the substrate and the first etch-stop layer to expose portions of the dummy channel holes that extend into the substrate, portions of the slit structures that extend into the substrate, and portions of the TSV that extend into the substrate.

In some embodiments, the forming the ACS on the backside of the second etch-stop layer includes disposing the ACS to cover the exposed portion of the dummy channel holes that extend into the substrate, the exposed portions of the slit structures that extend into the substrate, and the exposed portions of the TSV that extend into the substrate.

In some embodiments, the forming the ACS further includes disposing a first polycrystalline silicon layer on the backside of the second etch-stop layer; doping and annealing the first polycrystalline silicon layer; disposing a second polycrystalline silicon layer on a backside of the first polycrystalline silicon layer farther away from the alternating dielectric stack; and doping and annealing the second polycrystalline silicon layer.

In some embodiments, the method further includes forming an interlayer dielectric layer on a backside of the ACS farther away from the alternating dielectric stack.

In some embodiments, the forming the interlayer dielectric layer includes forming a dielectric filling layer on the backside of the ACS farther away from the alternating dielectric stack; forming, in the dielectric filling layer, a backside deep trench isolation (BDTI) penetrating through the ACS; removing portions of the dielectric filling layer corresponding to the channel structures to form first contact openings to expose the ACS; and removing portions of the dielectric filling layer corresponding to the TSV to form second contact openings to expose the TSV.

In some embodiments, the method also includes forming, on the interlayer dielectric layer, a backside interconnect layer farther away from the alternating dielectric stack.

In some embodiments, the forming the backside interconnect layer includes disposing a conductive material inside the first contact openings and the second contact openings and covering a backside of the interlayer dielectric layer farther away from the alternating dielectric stack to form ACS contact structures inside the first contact openings and TSV contact structures inside the second contact openings; and forming an isolating spacing between the ACS contact structures and the TSV contact structures.

Another aspect of the present disclosure provides a three-dimensional (3D) memory device. The 3D memory device includes an array common source (ACS); a film stack of alternating conductive and dielectric layers on a first side of the ACS; and channel structures penetrating through the film stack and extending into the ACS. Each channel structure includes a core filling film; a channel layer covering a sidewall of the core filling film; and a memory film disposed on a portion of the channel layer penetrating through the film stack. The ACS surrounds a portion of the channel layer extending from the film stack into the ACS such that the ACS connects to the portion of the channel layer extending from the film stack into the ACS.

In some embodiments, the ACS includes a p-type or n-type doped polycrystalline silicon layer.

In some embodiments, the film stack of alternating conductive and dielectric layers includes a staircase region.

In some embodiments, the 3D memory device also includes dummy channel holes penetrating through at least a portion of the film stack and extending into the ACS. The ACS surrounds portions of the dummy channel holes that extend from the film stack into the ACS.

In some embodiments, the 3D memory device also includes a slit structure (i.e., gate line slit) penetrating through the film stack and extending into the ACS. The slit structure is distant from the channel structures, and the ACS surrounds a portion of the slit structure that extend from the film stack into the ACS.

In some embodiments, the slit structure includes a gate dielectric layer disposed on a sidewall of the slit structure.

In some embodiments, the film stack also includes the gate dielectric layer covering sidewalls of the conductive layer. The film stack also includes a gate adhesion layer disposed between the gate dielectric layer and the conductive layer.

In some embodiments, the 3D memory device also includes a peripheral region covered by an insulating layer. The peripheral region is on a front side of the ACS closer to the film stack. The 3D memory device also includes a through-silicon-via (TSV) penetrating through the insulating layer in the peripheral region. The TSV is not in contact with the ACS.

In some embodiments, the TSV includes a TSV interface layer.

In some embodiments, the 3D memory device also includes an interlayer dielectric layer on a backside of the ACS farther away from the film stack.

In some embodiments, the interlayer dielectric layer includes a backside deep trench isolation (BDTI) penetrating through the ACS in a region with the TSV.

In some embodiments, the 3D memory device also includes a backside interconnect layer on a backside of the interlayer dielectric layer farther away from the film stack. The backside interconnect layer includes ACS contact structures connected to the ACS and corresponding to the channel structures; a TSV contact structure connected to the TSV; and an isolation spacing located between the TSV contact structure and the ACS contact structures.

Yet another aspect of the present disclosure provides a memory storage system. The memory storage system includes a three-dimensional (3D) NAND memory, where the 3D NAND memory includes an array common source (ACS); and a film stack of alternating conductive and dielectric layers, including conductive layers and first dielectric layers alternatingly stacked on a first side of the ACS. The 3D NAND memory also includes a backside interconnect layer disposed on a second side of the ACS, opposite from the first side, wherein the backside interconnect layer includes an ACS contact structure. The 3D NAND memory further includes a memory string penetrating through the film stack, where the memory string includes a channel layer having a first portion covered by a memory film; and a second portion in contact with the ACS and electrically connected to the ACS contact structure.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
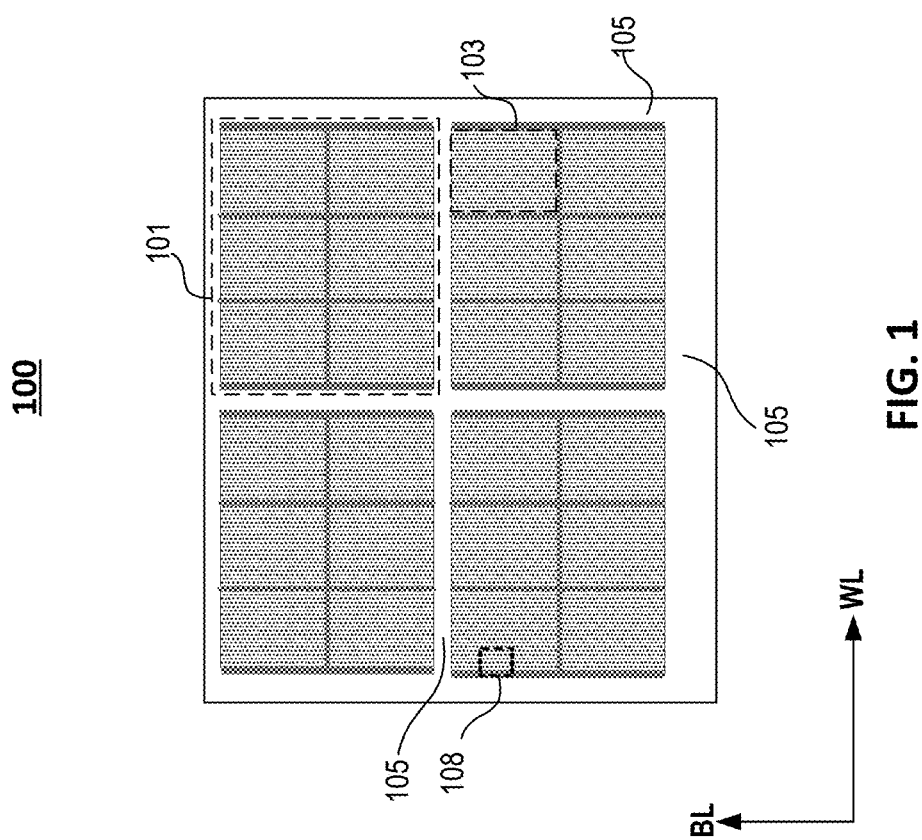
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a top-down view of an exemplary three-dimensional (3D) memory device 100, according to some embodiments of the present disclosure. The 3D memory device 100, such as 3D NAND Flash memory, can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
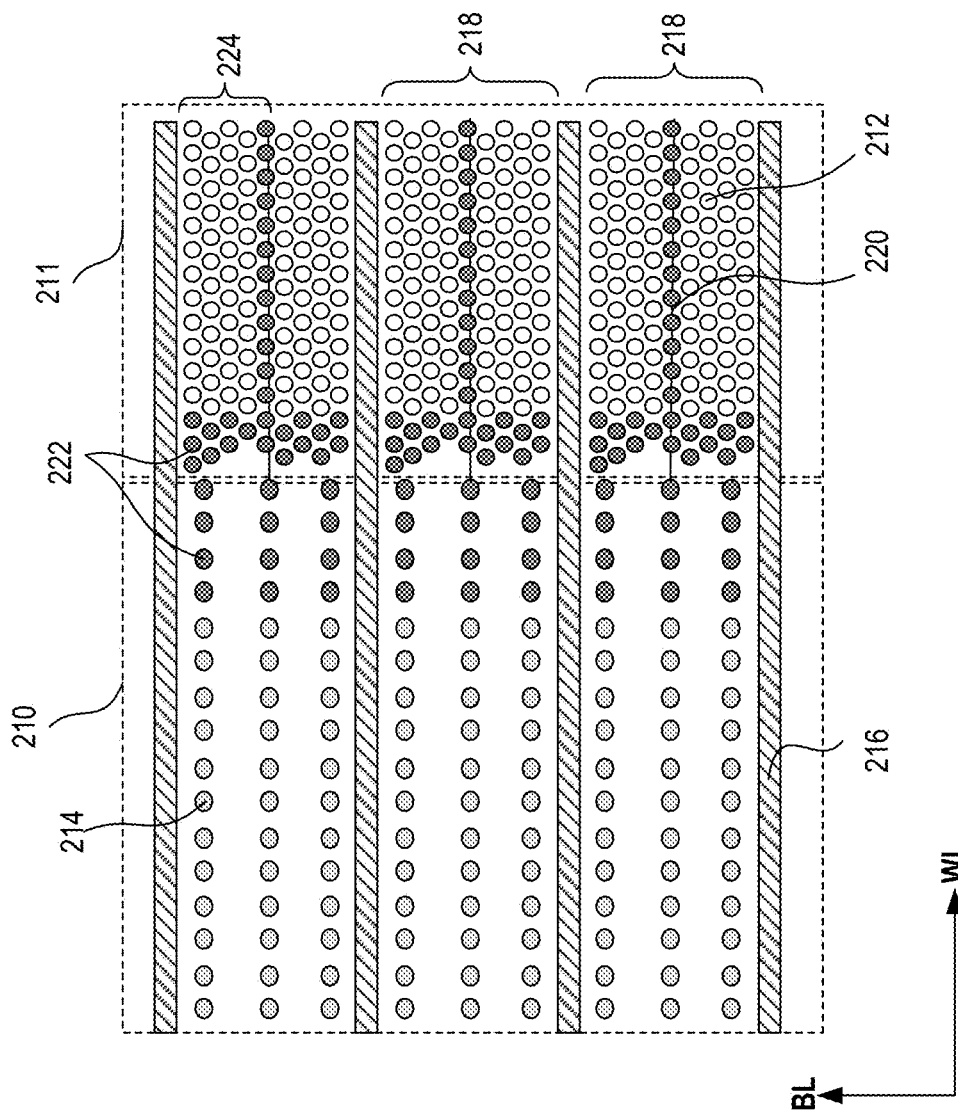
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact (e.g., array common source or ACS) for an array of memory strings 212 in channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, region 108 also includes dummy memory strings 222 for process variation control during fabrication and/or for additional mechanical support.

Figure 3:
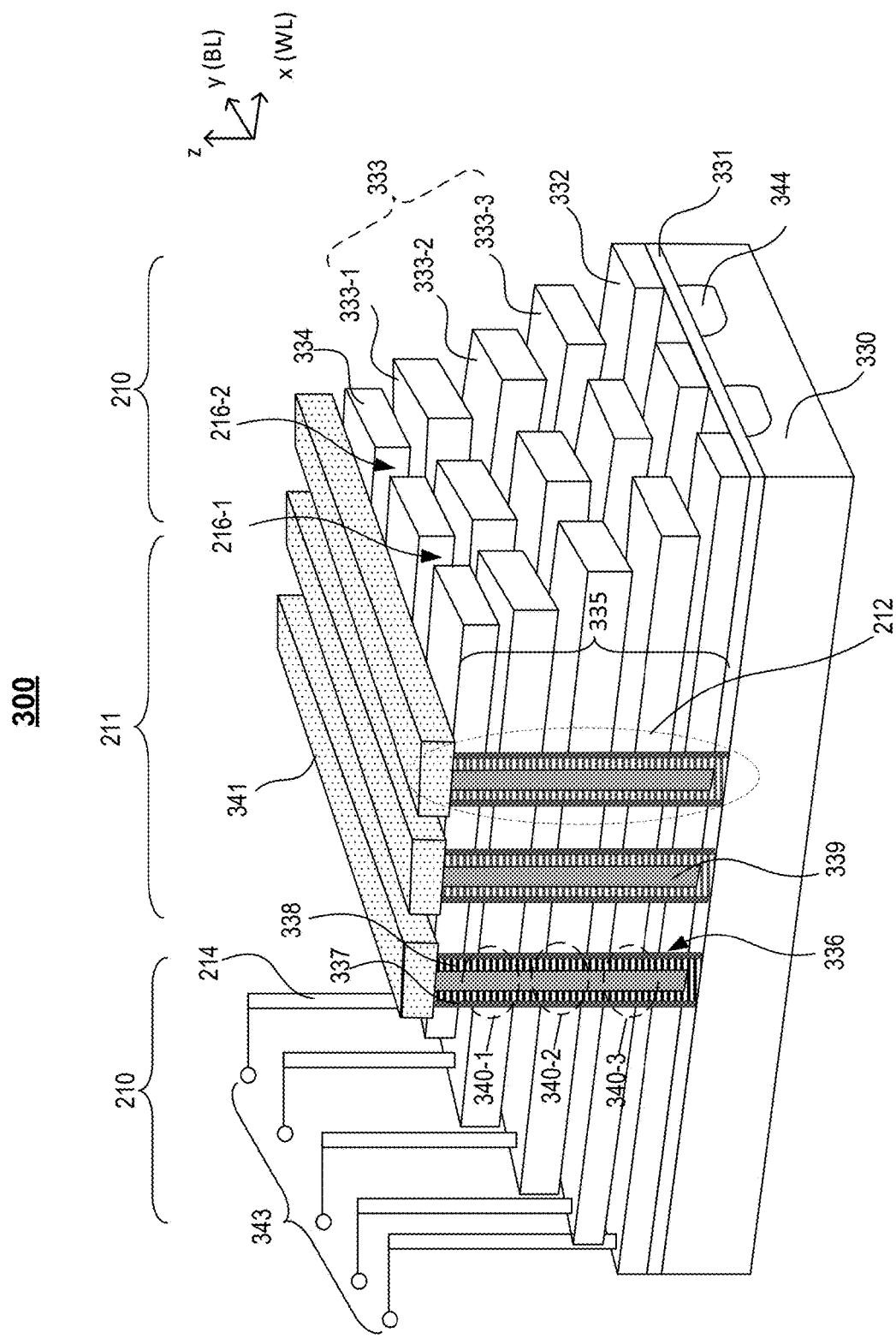
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes". The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 (e.g., 340-1, 340-2, 340-3) can be formed at the intersection of the control gate 333 (e.g., 333-1, 333-2, 333-3) and the memory string 212. A portion of the channel layer 338 responds to the respective control gate is also referred to as the channel layer 338 of the memory cell. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact (i.e., array common source) and dummy memory string. These structures are not shown in FIG. 3 for simplicity.

Figure 4:
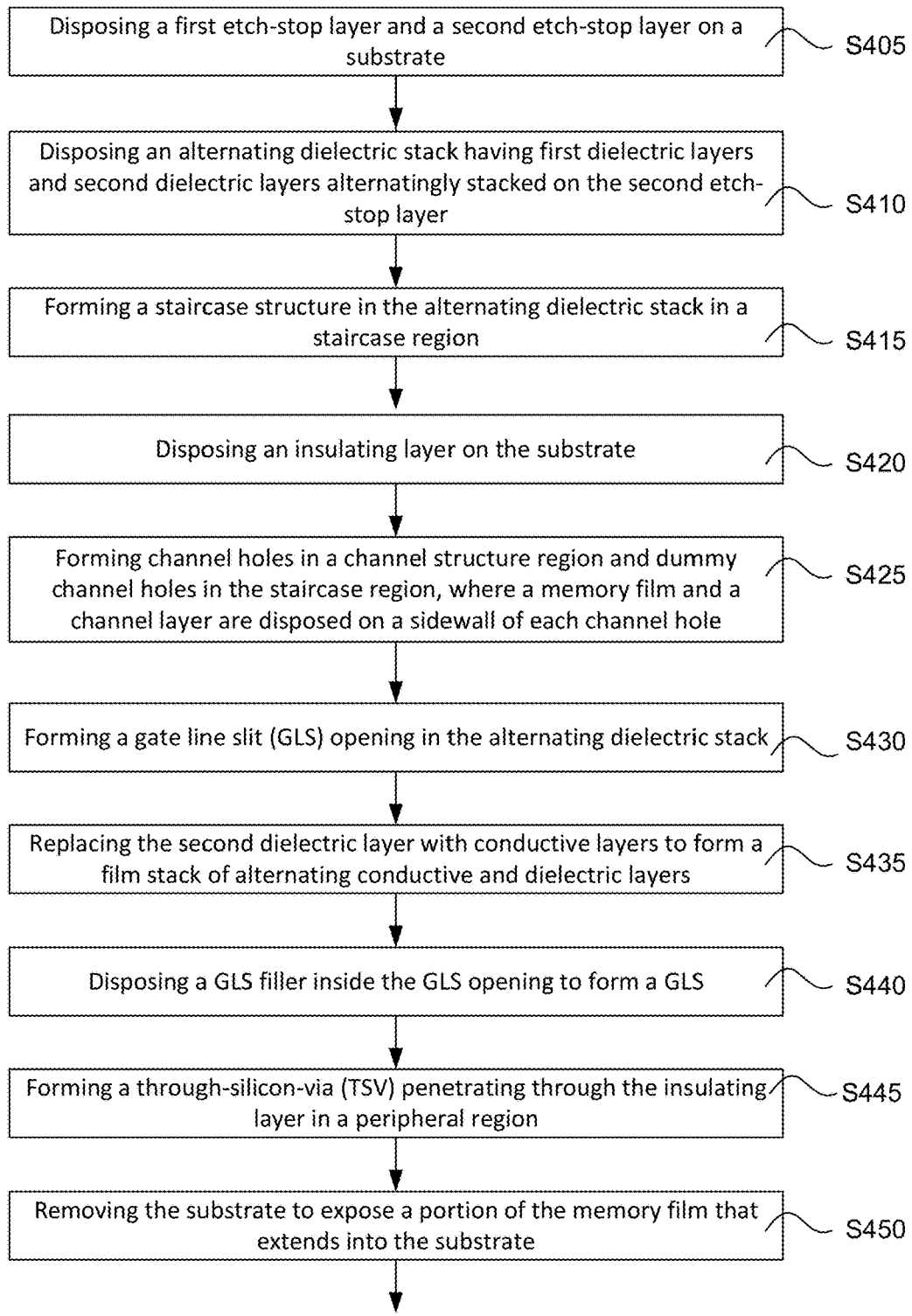
FIG. 4 illustrates a method for forming a 3D memory device, according to some embodiments of the present disclosure.
Figure 4:
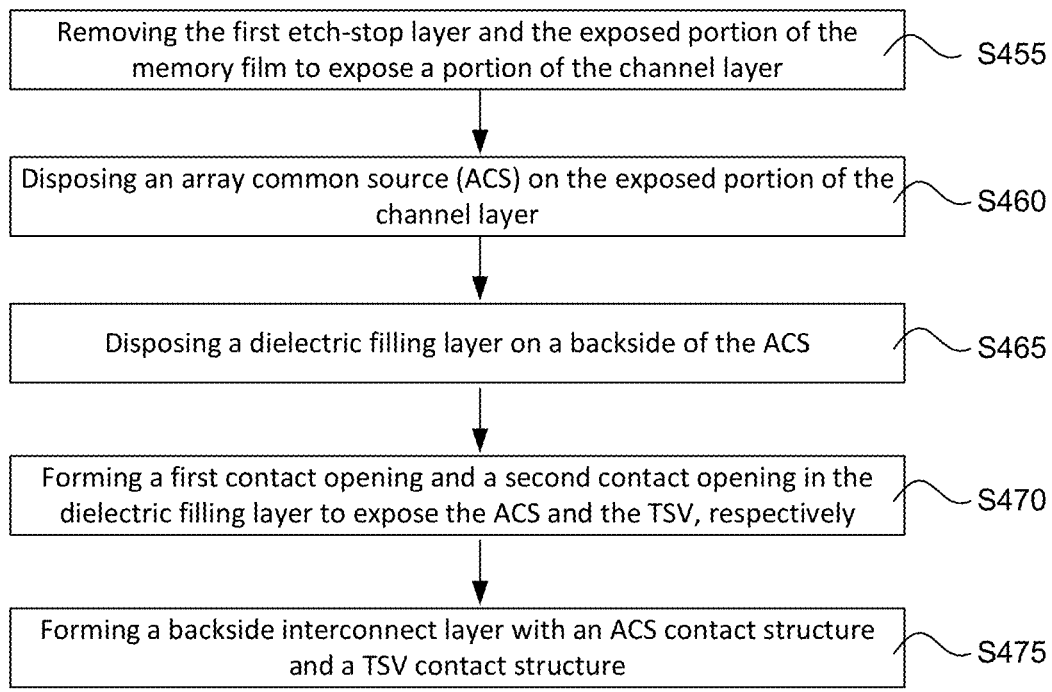

FIG. 4 illustrates a method 400 for forming a three-dimensional (3D) memory device, according to some embodiments of the present disclosure. It should be understood that process steps shown in method 400 are not exhaustive and that other steps can be performed as well before, after, or between any of the illustrated steps. In some embodiments, some process steps of method 400 can be omitted, or other process steps can also be included, which are not described here for simplicity. In some embodiments, process steps of method 400 can be performed in a different order and/or vary.

FIGS. 5, 6A-6B, 7-16 illustrate exemplary structures of the 3D memory device at certain process step according to the method 400.

Referring to FIG. 4, at process step S405, a first etch-stop layer and a second etch-stop layer can be disposed on a substrate. A cross-sectional view of an exemplary 3D memory structure 500 is shown in FIG. 5, according to the process step S405.

Figure 5:
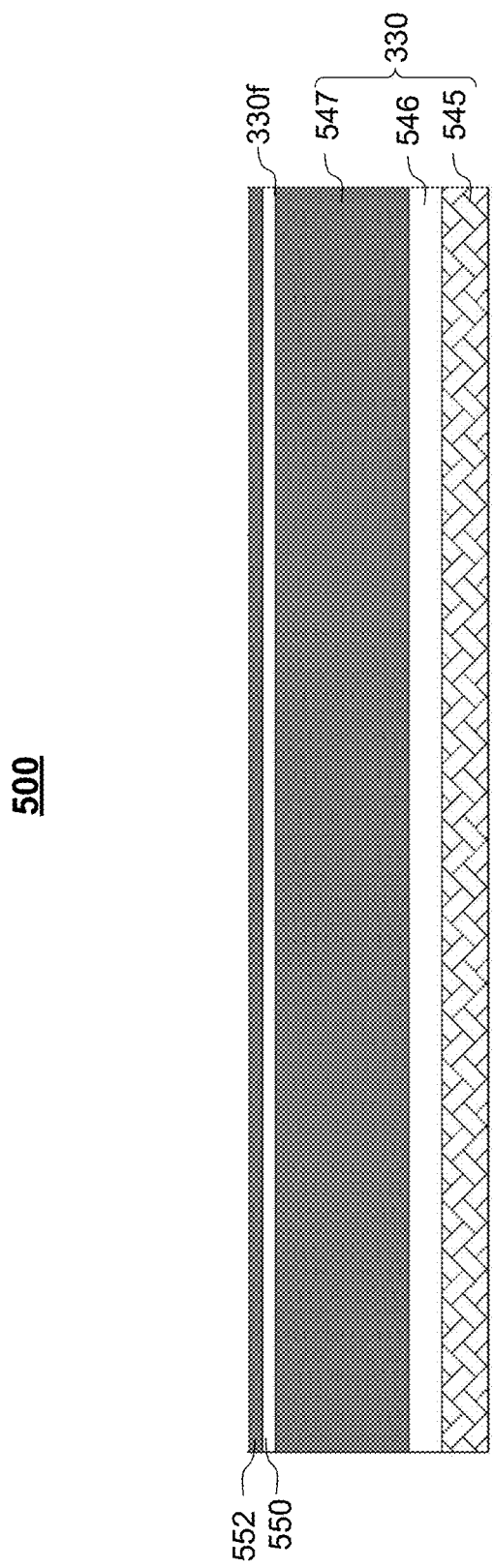
FIG. 5, 6A-6B, 7-16 illustrate cross-sectional views of 3D memory structures at certain process step, according to some embodiments of the present disclosure.

As shown in FIG. 5, the 3D memory structure 500 includes a first etch-stop layer 550 and a second etch-stop layer 552 disposed on the substrate 330.

The substrate 330 can provide a platform for forming subsequent structures. In some embodiments, the substrate 330 can be any suitable semiconductor substrate having any suitable semiconductor materials, such as monocrystalline, polycrystalline or single crystalline semiconductors. For example, the substrate 330 can include silicon, silicon germanium (SiGe), germanium (Ge), gallium arsenide (GaAs), gallium nitride, silicon carbide, III-V compound, II-VI compound, or any combinations thereof.

In some embodiments, the substrate 330 can have a composite structure and include a semiconductor layer 547 formed on a handle wafer 545. The substrate 330 also include an insulator layer 546 located in between the semiconductor layer 547 and the handle wafer 545. The handle wafer 545 can include glass, plastic, or another semiconductor substrate. The semiconductor layer 547 can include any suitable monocrystalline, polycrystalline or single crystalline semiconductors, for example, silicon, silicon germanium (SiGe), germanium (Ge), gallium arsenide (GaAs), gallium nitride, silicon carbide, III-V compound, II-VI compound, or any combinations thereof. The insulator layer 546 can include silicon oxide, silicon nitride, silicon oxynitride, TEOS, or any combination thereof. In some embodiments, the insulator layer 546 is silicon oxide and is also referred to as the sacrificial silicon oxide layer. In some embodiments, the semiconductor layer 547 is polycrystalline silicon and is also referred to as the sacrificial polycrystalline silicon layer. In some embodiments, the substrate 330 can be silicon-on-insulator (SOI), germanium-on-insulator (GOI), or silicon germanium-on-insulator (SGOI), where the semiconductor layer 547 can be crystalline silicon, crystalline germanium or crystalline silicon germanium.

In some embodiments, the semiconductor layer 547 can be disposed on the insulator layer 546 and the handle wafer 545 by using a deposition method such as, chemical vapor deposition (CVD), physical vapor deposition (PVD), plasma-enhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), sputtering, evaporation, and/or combinations thereof. In some embodiments, the semiconductor layer 547 can be formed on the insulator layer 546 and the handle wafer 545 through wafer bonding, SIMOX, etc.

A front surface 330f of the substrate 330 is also referred to as a "main surface" or a "top surface" of the substrate herein. Layers of materials can be disposed on the front surface 330f of the substrate 330. A "topmost" or "upper" layer is a layer farthest or farther away from the front surface 330f of the substrate. A "bottommost" or "lower" layer is a layer closest or closer to the front surface 330f of the substrate.

At process step S405, the first etch-stop layer 550 can be formed on the front surface 330f of the substrate 330, and the second etch-stop layer 552 can be formed on the first etch-stop layer 550. In some embodiments, the first etch-stop layer 550 and the second etch-stop layer 552 can be formed on the semiconductor layer 547 of the substrate 330.

The first etch-stop layer 550 and the second etch-stop layer 552 extend in a lateral direction that is parallel to the front surface 330f of the substrate 330.

The first etch-stop layer 550 and the second etch-stop layer 552 can be used as etch-stop layers in subsequent etching processes. The first etch-stop layer 550 and the second etch-stop layer 552 can be disposed by a thin film deposition process such as CVD, PVD, ALD, sputtering, evaporation, and/or any combination thereof. In some embodiments, the first etch-stop layer 550 can include silicon oxide, silicon nitride, silicon oxynitride, TEOS, etc. In some embodiments, the second etch-stop layer 552 can include amorphous or polycrystalline silicon. It should be noted that the first etch-stop layer 550 and the second etch-stop layer 552 can include any suitable material that has a predetermined etching selectivity (i.e. ratio of etching rate) with respect to materials to be etched.

Referring to FIG. 4, at process step S410, an alternating dielectric stack can be disposed on the second etch-stop layer over the substrate. At process step S415, a staircase structure can be formed in the alternating dielectric stack. At process step S420, an insulating layer can be disposed over the substrate, covering the staircase structure and the alternating dielectric stack. A cross-sectional view of an exemplary 3D memory structure 600 is shown in FIG. 6A, according to the process steps S410-S420.

Figure 6A:
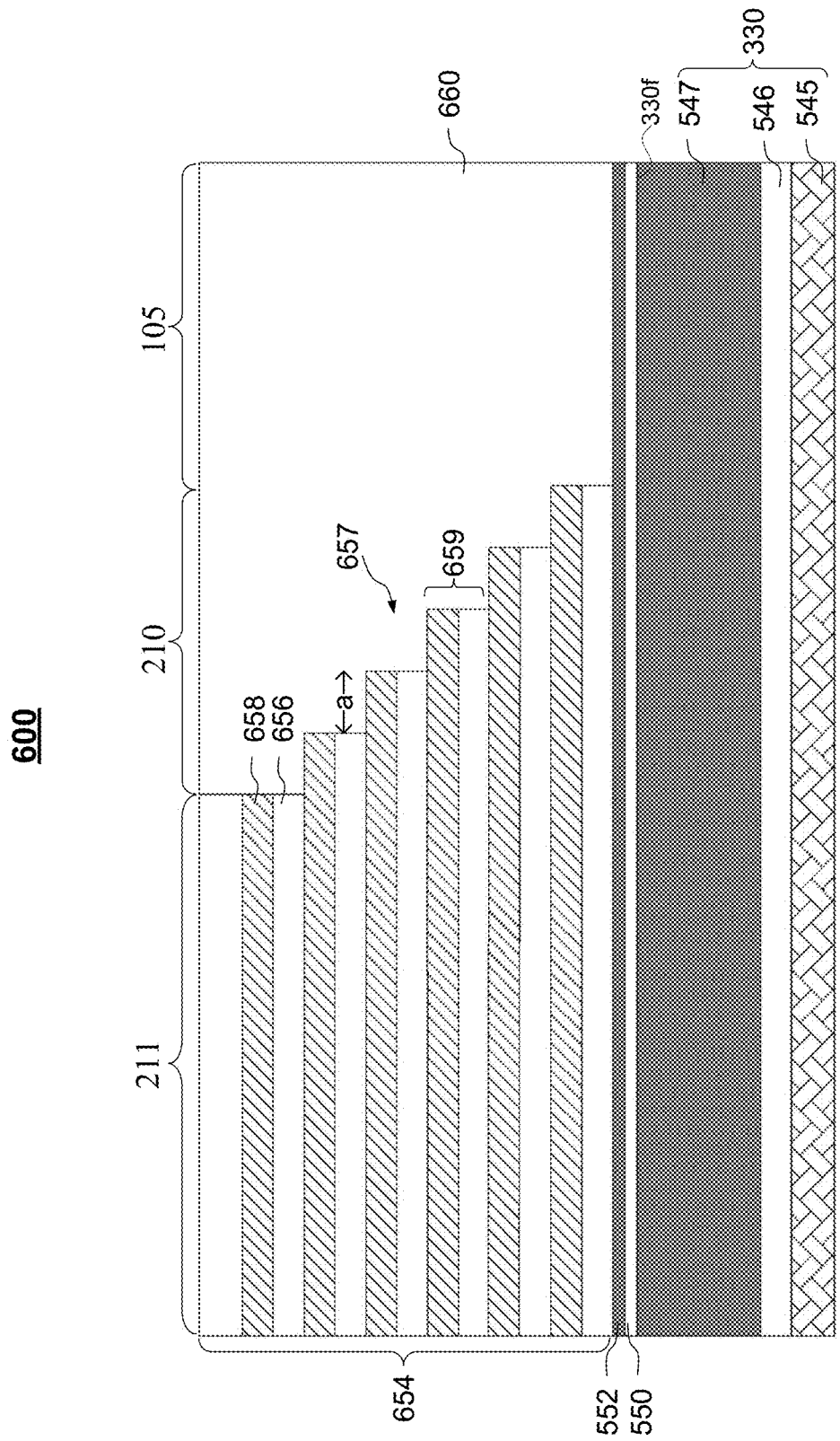

As shown in FIG. 6A, the 3D memory structure 600 includes an alternating dielectric stack 654 having first dielectric layers 656 and second dielectric layers 658 alternatingly stacked on the second etch-stop layer 552.

In some embodiments, the alternating dielectric stack 654 includes a plurality of dielectric layer pairs alternatingly stacked along a vertical direction (i.e., z-direction) perpendicular to the front surface 330f of the substrate 330, where each dielectric layer pair includes the first dielectric layer 656 (also referred to as "dielectric layer") and the second dielectric layer 658 (also referred to as "sacrificial layer") that is different from the first dielectric layer 656. The alternating dielectric stack 654 extends in a lateral direction that is parallel to the front surface 330f of the substrate 330.

In the alternating dielectric stack 654, first dielectric layers 656 and second dielectric layers 658 alternate in a vertical direction, perpendicular to the substrate 330. In the other words, each second dielectric layer 658 can be sandwiched between two first dielectric layers 656, and each first dielectric layer 656 can be sandwiched between two second dielectric layers 658 (except the bottommost and the topmost layer).

The formation of the alternating dielectric stack 654 can include disposing the first dielectric layers 656 to each have the same thickness or to have different thicknesses. Example thicknesses of the first dielectric layers 656 can range from 10 nm to 500 nm, preferably about 25 nm. Similarly, the second dielectric layer 658 can each have the same thickness or have different thicknesses. Example thicknesses of the second dielectric layer 658 can range from 10 nm to 500 nm, preferably about 35 nm. It should be understood that the number of dielectric layer pairs in FIG. 6A is for illustrative purposes only and that any suitable number of layers may be included in the alternating dielectric stack 654.

In some embodiments, the first dielectric layer 656 includes any suitable insulating materials, for example, silicon oxide, silicon oxynitride, silicon nitride, TEOS or silicon oxide with F-, C-, N-, and/or H-incorporation. The first dielectric layer 656 can also include high-k dielectric materials, for example, hafnium oxide, zirconium oxide, aluminum oxide, tantalum oxide, or lanthanum oxide films.

In some embodiments, the first dielectric layer 656 can be any combination of the above materials.

The formation of the first dielectric layer 656 can include any suitable deposition methods such as, chemical vapor deposition (CVD), physical vapor deposition (PVD), plasma-enhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), sputtering, evaporation, thermal oxidation, nitridation, any other suitable deposition method, and/or combinations thereof.

In some embodiments, the second dielectric layer 658 includes any suitable material that is different from the first dielectric layer 656 and can be removed selectively with respect to the first dielectric layer 656. For example, the second dielectric layer 658 can include silicon oxide, silicon oxynitride, silicon nitride, TEOS, poly-crystalline silicon, poly-crystalline germanium, poly-crystalline germanium-silicon, and any combinations thereof. In some embodiments, the second dielectric layer 658 also includes amorphous semiconductor materials, such as amorphous silicon or amorphous germanium. The second dielectric layer 658 can be disposed using a similar technique as the first dielectric layer 656, such as CVD, PVD, ALD, sputtering, evaporation, thermal oxidation or nitridation, or any combination thereof.

In some embodiments, the first dielectric layer 656 can be silicon oxide and the second dielectric layer 658 can be silicon nitride.

In some embodiments, the alternating dielectric stack 654 can include layers in addition to the first dielectric layer 656 and the second dielectric layer 658, and can be made of different materials and/or with different thicknesses.

As shown in FIG. 6A, the 3D memory structure 600 also includes a staircase structure 657 with a plurality of staircase steps 659 formed in the alternating dielectric stack 654 in the staircase region 210. The staircase step 659, or a "staircase layer", refers to a layer stack with the same lateral dimension in a surface parallel to the substrate surface 330*f*. Each of the staircase steps 659 terminates at a shorter length than the staircase step underneath, with a lateral dimension "a" shown in FIG. 6A.

In some embodiments, each of the staircase steps 659 includes one pair of the first dielectric layer 656 and the second dielectric layer 658. In some embodiments, each of the staircase steps 659 can include two or more pairs of the first dielectric layer 656 and the second dielectric layer 658. As shown in FIG. 6A, each of the staircase steps 659 includes one pair of the first dielectric layer 656 and the second dielectric layer 658, where the second dielectric layer 658 is on top of the first dielectric layer 656. Each of the staircase steps 659 exposes a portion of the second dielectric layer 658 at the end of alternating dielectric stack 654.

The staircase structure 657 can be formed by applying a repetitive etch-trim process on the alternating dielectric stack 654. The etch-trim process includes an etching process and a trimming process. During the etching process, a portion of the staircase step 659 with exposed surface can be removed. The remaining portion of the staircase step 659, either covered by upper levels of staircase steps or covered by a patterning mask, is not etched. The etch depth is a thickness of the staircase step 659. In some embodiments, the thickness of the staircase step 659 is a thickness of one pair of the first dielectric layer 656 and the second dielectric layer 658. The etching process for the first dielectric layer 656 can have a high selectivity over the second dielectric layer 658, and/or vice versa. Accordingly, an underlying dielectric layer pair can function as an etch-stop layer. By switching etching process for each layer, the staircase step 659 can be etched during one etching cycle. And as a result, one of the staircase steps 659 can be formed during each etch-trim cycle.

In some embodiments, the staircase step 659 can be etched using an anisotropic etching such as a reactive ion etch (RIE) or other dry etch processes. In some embodiments, the first dielectric layer 656 is silicon oxide. In this example, the etching of silicon oxide can include RIE using fluorine based gases, for example, carbon-fluorine ($CF_4$), hexafluoroethane ($C_2F_6$), $CHF_3$, or $C_3F_6$ and/or any other suitable gases. In some embodiments, the silicon oxide layer can be removed by wet chemistry, such as hydrofluoric acid or a mixture of hydrofluoric acid and ethylene glycol. In some embodiments, a timed etching approach can be used. In some embodiments, the second dielectric layer 658 is silicon nitride. In this example, the etching of silicon nitride can include RIE using $O_2$, $N_2$, $CF_4$, $NF_3$, $Cl_2$, HBr, $BCl_3$, and/or combinations thereof. The methods and etchants to remove a single layer stack should not be limited by the embodiments of the present disclosure.

The trimming process includes applying a suitable etching process (e.g., an isotropic dry etch or a wet etch) on the patterning mask such that the patterning mask can be pulled back laterally. The lateral pull-back dimension determines the lateral dimension "a" of each step of the staircase structure 657. After trimming the patterning mask, one portion of a topmost staircase step 659 is exposed and the other potion of the topmost staircase step 659 remains covered by the patterning mask. The next cycle of etch-trim process resumes with the etching process. In some embodiments, the patterning mask trimming process can include dry etching, such as ME using $O_2$, Ar, $N_2$, etc. It is noted that the number of staircase structures and the number of dielectric layer pairs in the 3D memory structure 600 are not limited to the examples herein.

As shown in FIG. 6A, the 3D memory structure 600 also includes an insulating layer 660 disposed over the substrate, covering the staircase structure 657, the alternating dielectric stack 654 and a portion of the second etch-stop layer 552. The insulating layer 660 can include any suitable insulating material, for example, silicon oxide, silicon oxynitride, silicon nitride, TEOS, spin-on-glass, low-k dielectric material, such as carbon-doped oxide (CDO or SiOC or SiOC:H), or fluorine doped oxide (SiOF), etc. The insulating layer 660 can be disposed by CVD, PVD, ALD, sputtering, evaporating, etc. In some embodiments, the insulating layer 660 can have a planar top surface over the staircase structure 657 and the alternating dielectric stack 654. The insulating layer 660 can be planarized using CMP and/or ME etch-back.

In some embodiments, a barrier layer (not shown in FIG. 6A) can be disposed on the staircase structure and the alternating dielectric stack, prior to disposing the insulating layer 660. The barrier layer can cover the staircase structure 657 and the alternating dielectric stack 654 on both lateral surfaces and vertical sidewalls. The barrier layer on lateral surfaces and vertical sidewalls can have the same or different thicknesses. The barrier layer can function as an etch-stop for forming contact structures on the staircase steps.

At completion of the process step S420, the staircase structure 657 is form in the staircase region 210, which can be used to form electrical contacts to word lines in subsequent processes. In the peripheral region 105, the insulating layer 660 covers the first/second etch-stop layers 550/552 and the substrate 330, where electrical contacts to peripheral circuits can be formed in subsequent processes. In some embodiments, peripheral devices can be formed in the periphery region 105 on the front surface 330f of the substrate 330. The peripheral devices can include any suitable semiconductor devices, for example, metal oxide semiconductor field effect transistors (MOSFETs), diodes, resistors, capacitors, etc. The peripheral devices can be used in the design of digital, analog and/or mixed signal circuits supporting the storage function of the memory core, for example, row and column decoders, drivers, page buffers, sense amplifiers, timing and controls.

Figure 6B:
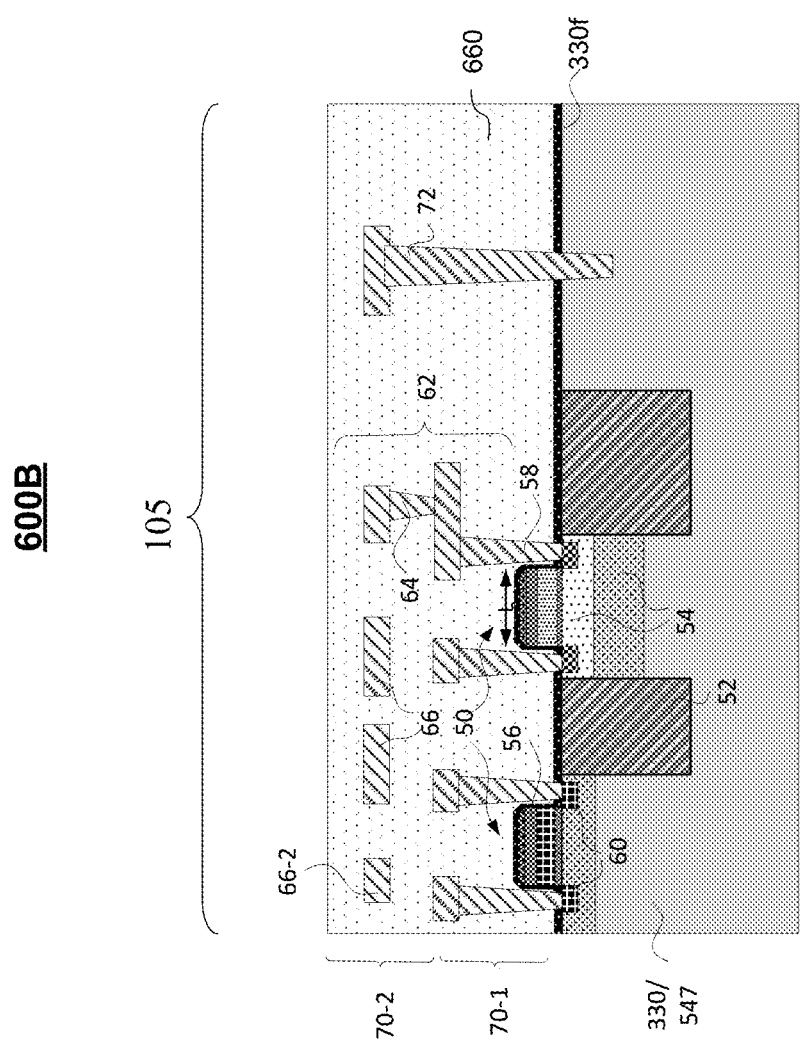

FIG. 6B illustrates an exemplary peripheral circuitry 600B in the peripheral region 105, according to some embodiments of the present disclosure. The peripheral circuitry 600B can be a portion of the 3D memory structure 600 shown in FIG. 6A. The peripheral circuitry 600B can be formed before the alternating dielectric stack 654 is disposed. The peripheral circuitry 600B can also be formed after the staircase structure 657 is formed. It is noted that the sequence to form the peripheral circuitry 600B in the peripheral region 105 and the staircase structure 657 in the staircase region 210 is not limited to the examples discussed above.

The peripheral circuitry 600B can include one or more peripheral devices 50 on the front surface of the substrate 330 (e.g., the semiconductor layer 547). The peripheral device 50 can be formed "on" the substrate 330, in which the entirety or part of the peripheral device 50 is formed in the substrate 330 (e.g., below the front surface 330f of the substrate 330) and/or directly on the substrate 330. The peripheral device 50 can include any suitable semiconductor devices, for example, metal oxide semiconductor field effect transistors (MOSFETs), bipolar junction transistors (BJTs), diodes, resistors, capacitors, inductors, etc. Among the semiconductor devices, p-type and/or n-type MOSFETs (i.e., CMOS) are widely implemented in logic circuit design, and are used as examples for the peripheral device 50 in the present disclosure.

A peripheral device 50 can be either a p-channel MOSFET or an n-channel MOSFET and can include, but not limited to, an active device region surrounded by a shallow trench isolation (STI) 52, a well 54 formed in the active device region with n-type or p-type doping, a gate stack 56 that includes a gate dielectric, a gate conductor and/or a gate hard mask. The peripheral device 50 can also include a source/drain extension and/or halo region (not shown in FIG. 6B), a gate spacer 58 and a source/drain 60 locating on each side of the gate stack. The peripheral device 50 can further include a silicide contact area (not shown) in the top portion of the source/drain. Other known devices can be also formed on the substrate 330. The structure and fabrication method of the peripheral device 50, are known to those skilled in the art, and are incorporated herein for entirety.

The peripheral device 50 can be formed on the substrate 330 with a planar active device region (as shown in FIG. 6B), where the direction of MOSFET's channel and current flow is parallel to the front surface 330f of the substrate 330. In some embodiments, the peripheral device 50 can also be formed on the substrate 330 with a 3D active device region, for example a so-called "FINFET" in a shape like a "FIN" (not shown), where the gate stack of the MOSFET is wrapped around the FIN, and the MOSFET's channel lies along three sides of the FIN (top and two sidewalls under the gate). The structure and methods for FINFET device are known to those skilled in the art and are not discussed further in present disclosure.

In some embodiments, the peripheral circuitry 600B can include a peripheral interconnect layer 62 above the peripheral devices 50, to provide electrical connections between different peripheral devices 50 and external devices (e.g., power supply, another chip, I/O device, etc.). In some embodiments, the peripheral interconnect layer 62 can be formed in the insulating layer 660. In some embodiments, the peripheral interconnect layer 62 can be formed in an insulating layer different from the insulating layer 660 in FIG. 6A.

The peripheral interconnect layer 62 can include one or more interconnect structures, for example, one or more vertical contact structures 64 and one or more lateral conductive lines 66. The contact structure 64 and conductive line 66 can broadly include any suitable types of interconnects, such as middle-of-line (MOL) interconnects and back-end-of-line (BEOL) interconnects. The contact structure 64 and conductive line 66 in the peripheral circuitry 600B can include any suitable conductive materials such as tungsten (W), cobalt (Co), copper (Cu), titanium (Ti), tantalum (Ta), aluminum (Al), titanium nitride (TiN), tantalum nitride (TaN), nickel, silicides ($WSi_x$, $CoSi_x$, $NiSi_x$, $AlSi_x$, etc.), metal alloys, or any combination thereof. The conductive materials can be deposited by one or more thin film deposition processes such as chemical vapor deposition (CVD), plasma-enhanced CVD (PECVD), physical vapor deposition (PVD), atomic layer deposition (ALD), electroplating, electroless plating, sputtering, evaporation, or any combination thereof.

In FIG. 6B, two conductive levels 70-1 and 70-2 (also referred to as "metal levels") are illustrated as an example, where each metal level 70 (e.g., 70-1 or 70-2) include the contact structures 64 and the conductive lines 66. The conductive lines 66 of the same metal level are located at the same distance from the substrate 330. The number of metal levels 70 for the peripheral circuitry 600B is not limited and can be any number optimized for the performance of the 3D memory.

The peripheral interconnect layer 62 can be formed by stacking metal levels 70 from bottom to the top of the peripheral circuitry 600B. In the example of the peripheral circuitry 600B in FIG. 6B, the bottom metal level 70-1 can be formed first and then the upper metal level 70-2 can be formed on top of the bottom metal level 70-1.

In some embodiments, peripheral circuitry 600B also includes one or more substrate contacts 72, where the substrate contacts 72 provide electrical connections to the substrate 330. The substrate contact 72 can include one or more conductive levels 70 with multiple tiers of vertical contact structures 64 and lateral conductive lines 66. In FIG. 6B, substrate contact 72 with one tier of contact structure and conductive line is shown as an example, where the vertical contact structure of the substrate contact 72 extends through the insulating layer 660 and electrically contacts the substrate 330.

The peripheral device 50, however, is not limited to MOSFET. The structures of the other devices, for example diodes, resistors, capacitors, inductors, BJTs, etc., can be formed simultaneously during MOSFETs fabrication through different mask design and layout. To form devices other than MOSFETs, process steps can be added or modified in a MOSFET's process flow, for example, processes to obtain different dopant profiles, film thicknesses or material stacks, etc. In some embodiments, the peripheral device 50 other than MOSFET can also be fabricated with additional design and/or lithography mask levels to achieve specific circuit requirements. The peripheral devices 50 can be used to form any digital, analog, and/or mixed-signal circuits for the operation of the peripheral circuitry 600B. The peripheral circuitry 600B can perform, for example, row/column decoding, timing and control, reading, writing and erasing data of the memory array, etc.

Referring to FIG. 4, at process step S425, a plurality of channel holes and a plurality of dummy channel holes can be formed in the channel structure region and the staircase region, respectively. A memory film and a channel layer can be disposed on a sidewall of each channel hole. A cross-sectional view of an exemplary 3D memory structure 700 is shown in FIG. 7, according to the process step S425.

Figure 7:
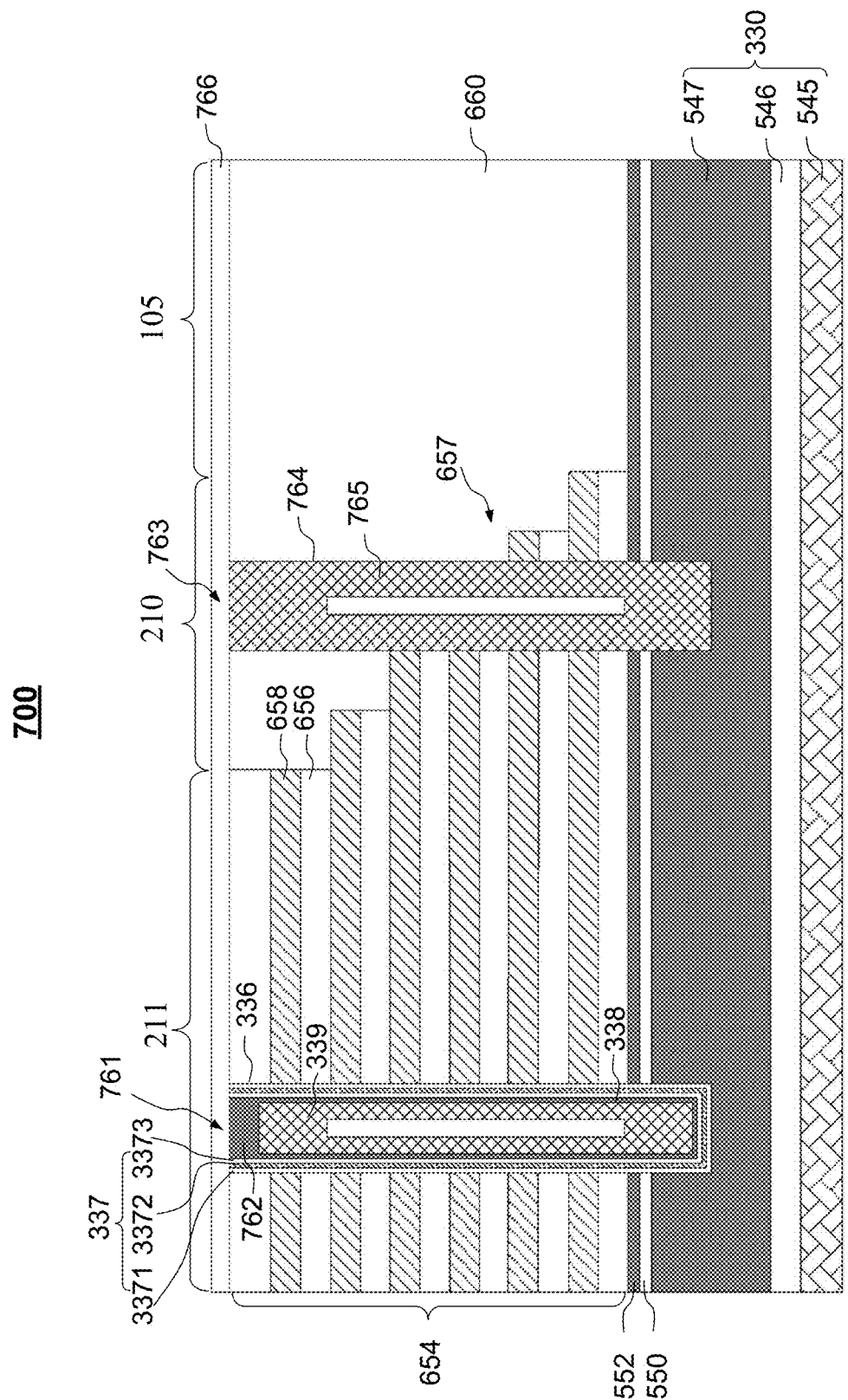

As shown in FIG. 7, the 3D memory structure 700 includes the plurality of channel holes 336 in the channel structure region 211. The plurality of channel holes 336 penetrate vertically through the insulating layer 660 and the alternating dielectric stack 654. In some embodiments, the plurality of channel holes 336 penetrate further through the second etch-stop layer 552 and the first etch-stop layer 550 and extend into the substrate 330, for example, into the semiconductor layer 547.

Techniques used to form the channel holes 336 can include processes such as photolithography and etching. The etching process to form the channel holes 336 can also include a dry etching, a wet etching, or a combination thereof. In some embodiments, the alternating dielectric stack 654 can be etched using an anisotropic etching such as a reactive ion etch (ME). In some embodiments, fluorine or chlorine based gases such as carbon-fluorine ($CF_4$), hexafluoroethane ($C_2F_6$), $CHF_3$, $C_3F_6$, $Cl_2$, $BCl_3$, etc., or any combination thereof, can be used. The methods and etchants to etch the first dielectric layer 656 and the second dielectric layers 658 should not be limited by the embodiments of the present disclosure. In some embodiments, the semiconductor layer 547 can function as an etch-stop during the etching process for the channel holes 336 such that the channel holes 336 do not extend further into the insulator layer 546 and the handle wafer 545.

After forming the channel holes 336, the memory film 337 can be disposed sidewalls of the channel holes 336. In some embodiments, the memory film 337 can be a composite layer including a tunneling layer 3373, a storage layer 3372 (also known as "charge trap/storage layer"), and a blocking layer 3371. In some embodiments, the tunneling layer 3373, the storage layer 3372, and the blocking layer 3371 are arranged along a direction from a center of the channel hole 336 toward the outer of the channel hole 336 in the above order. The tunneling layer 3373 can include silicon oxide, silicon nitride, or any combination thereof. The blocking layer 3371 can include silicon oxide, silicon nitride, high dielectric constant (high-k) dielectrics, or any combination thereof. The storage layer 3372 can include silicon nitride, silicon oxynitride, silicon, or any combination thereof. In some embodiments, the memory film 337 includes ONO dielectrics (e.g., the tunneling layer 3373 including silicon oxide, the storage layer 3372 including silicon nitride, and the blocking layer 3371 including silicon oxide). The memory film 337 can be formed by using a thin film deposition process, such as ALD, CVD, PVD, sputtering or any other suitable process. In some embodiments, a thickness of the memory film 337 can be in a range from about 10 nm to about 50 nm.

Next, the channel layer 338 and the core filling film 339 can be disposed in the channel holes 336, where the channel layer 338 covers a sidewall of the memory film 337 inside the channel hole 336. The channel layer 338 can be any suitable semiconductor material such as silicon. In some embodiments, the channel layer 338 can be amorphous, polysilicon, or single crystalline silicon. The channel layer 338 can be formed by any suitable thin film deposition processes including, but not limited to, CVD, PVD, ALD, sputtering, evaporation, or a combination thereof. In some embodiments, a thickness of the channel layer 338 can be in a range from about 10 nm to about 30 nm.

In some embodiments, the core filling film 339 can be disposed to fill the channel holes 336 to form a channel structure 761. In some embodiments, the middle of the core filling film 339 can include one or more seams. The core filling film 339 can be any suitable insulator, for example, silicon oxide, silicon nitride, silicon oxynitride, spin-on-glass, boron or phosphorus doped silicon oxide, carbon-doped oxide (CDO or SiOC or SiOC:H), fluorine doped oxide (SiOF), or any combination thereof. The core filling film 339 can be deposited by using, for example, ALD, PVD, CVD, spin-coating, sputtering, or any other suitable film deposition techniques. The core filling film 339 can also be formed by using repeated deposition and etch-back processes. The etch-back process can include, but not limited to, a wet etching, a dry etching, or a combination thereof. In some embodiments, one or more seams can be formed in the core filling film 339 to reduce mechanical stress.

In some embodiments, the 3D memory structure 700 also includes a channel top plug 762 at a top portion of the channel structure 761. The channel top plug 762 can form electrical contact with the channel layer 338 inside the channel hole 336. The channel top plug 762 can be amorphous or polycrystalline silicon, and can include metal, metal alloy and/or metal silicide, for example, tungsten, titanium, tantalum, tungsten nitride, titanium nitride, tantalum nitride, nickel silicide, cobalt silicide, tungsten silicide, titanium silicide, or a combination thereof. The channel top plug 762 can be formed by a recess etching process followed by thin film deposition. The recess etching process includes wet etch, dry etch or a combination thereof. The thin film deposition includes CVD, PVD, ALD, sputtering, or any other suitable processes.

In some embodiments, the 3D memory device 700 can also include an epitaxial plug (not shown) at bottom of the channel structure 761. The epitaxial plug can include any suitable semiconductor material, such as silicon, silicon germanium, germanium, gallium arsenide, gallium nitride, III-V compound, or any combination thereof. The epitaxial plug can be epitaxially grown from the substrate 330 (e.g, the semiconductor layer 547). In some embodiments, the epitaxial plug can also include a polycrystalline semiconductor material, for example, polycrystalline silicon. In some embodiments, a portion of the memory film 337 at the bottom of the channel hole 336 can be removed such that the channel layer 338 can directly contact with the epitaxial plug.

It is noted that the number and arrangement of the channel structure 761 in the channel structure region 211 can be designed according to actual storage requirements, and are not limited to the example shown in FIG. 7. As discussed previously with respect to FIG. 2, the channel structure region 211 provides the storage function for the three-dimensional memory.

As shown in FIG. 7, the 3D memory structure 700 also includes a plurality of dummy channel holes (DCHs) 764 in the staircase region 210. The DCHs 764 penetrate through the insulating layer 660, a portion of the staircase structure 657 (i.e., a portion of the alternating dielectric stack 654), the second etch-stop layer 552 and the first etch-stop layer 550, and extend into the substrate 330 (e.g., the semiconductor layer 547). The forming of the DCHs 764 includes lithography and etching, where the etching process can include dry etching, wet etching, and/or a combination thereof. In some embodiments, the etching processes for the DCHs 764 include an anisotropic etching such as RIE.

After forming the DCHs 764, DCH fillers 765 can be disposed inside the DCHs 764 to form dummy channel structures 763. The DCH filler 765 includes any suitable insulator, for example, silicon oxide, silicon nitride, silicon oxynitrde, TEOS, high-k dielectric material ($Al_2O_3$, $HfO_2$, $Ta_2O_3$, $ZrO_2$, $La_2O_3$, etc), or any combination thereof. The DCH filler 765 can be disposed by any suitable thin film deposition techniques such as CVD, ALD, PVD, sputtering, evaporation, etc. In some embodiments, one or more seams can be formed in the DCH fillers 765 to reduce mechanical stress. The dummy channel structures 763 formed in the staircase region 210 can be configured to provide mechanical support for the 3D memory structures in the subsequent processes.

In some embodiments, the channel structures 761 and the dummy channel structures 763 can be planarized to have coplanar surfaces. The planarization process includes RIE etch back, CMP or a combination thereof.

The 3D memory structure 700 also includes a first capping layer 766, disposed on the insulating layer 660 to cover the channel structures 761 in the channel structure region 211 and the dummy channel structures 763 in the staircase region 210. The first capping layer 766 can include silicon oxide, silicon nitride, silicon oxynitride, TEOS, or a combination thereof. The first capping layer 766 can be deposited by CVD, PVD, ALD, sputtering, etc.

Referring to FIG. 4, at process step S430, a gate line slit (GLS) opening can be formed in the alternating dielectric stack. At process step S435, the second dielectric layers in the alternating dielectric stack can be replaced with conductive layers to form the film stack of alternating conductive and dielectric layers. At process step S440, a GLS filler can be disposed inside the GLS opening to form a GLS. A cross-sectional view of an exemplary 3D memory structure 800 is shown in FIG. 8, according to the process step S430-S440.

Figure 8:
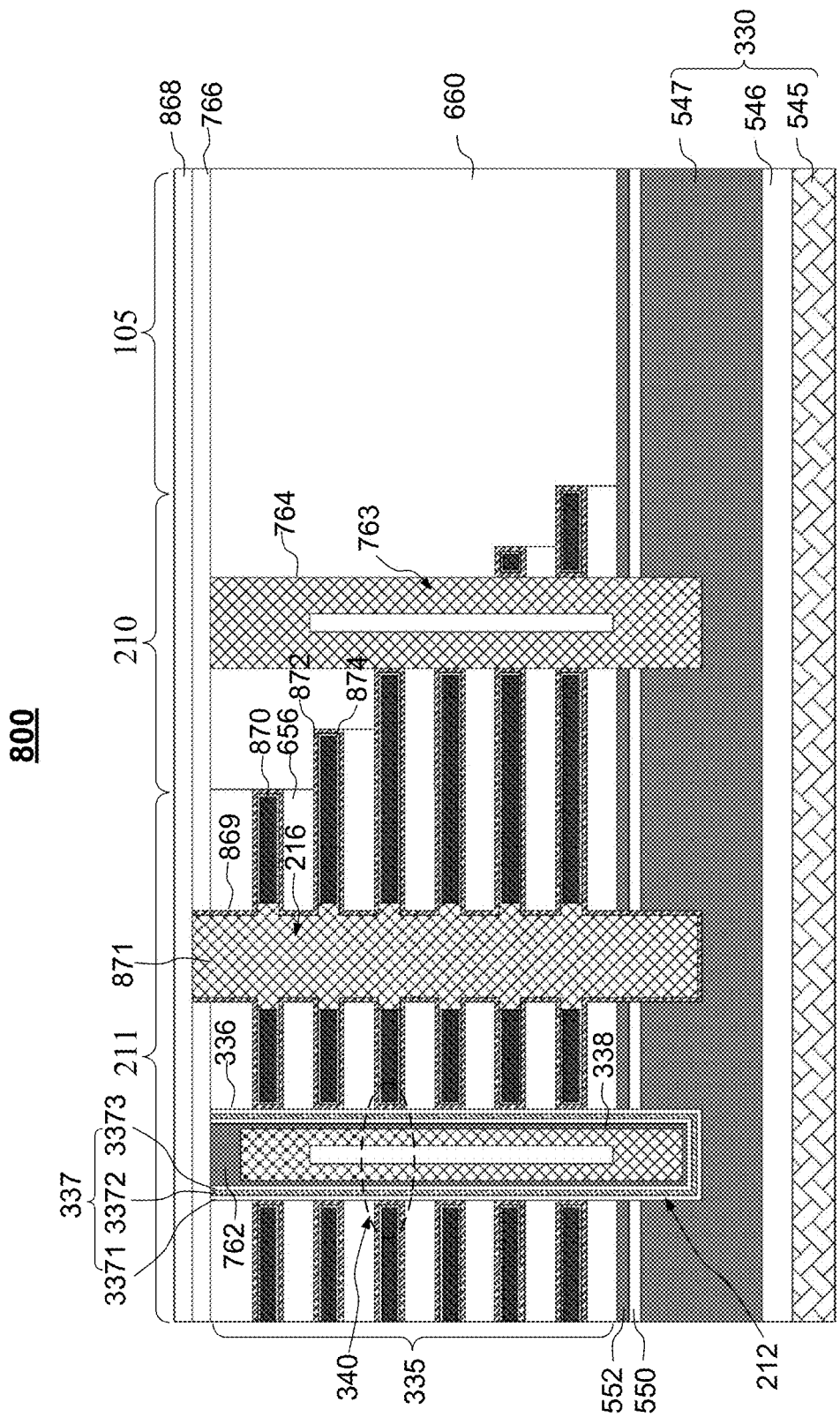

As shown in FIG. 8, the 3D memory structure 800 includes a gate line slit (GLS) opening 869 formed in the alternating dielectric stack 654. The GLS opening 869 penetrates through the insulating layer 660 and the alternating dielectric stack 654 (in FIG. 7). In some embodiments, the GLS opening 869 also penetrates through the second etch-stop layer 552 and the first etch-stop layer 550, and further extends into the substrate 330 (e.g., into the semiconductor layer 547). The GLS opening 869 can be formed by a lithography process and an etching process. The etching process can include any suitable dry etching, wet etching and/or a combination thereof. In the subsequent processes, the GLS opening 869 can be used to form the slit structure 216 as illustrated in FIG. 2.

At process step S435, the second dielectric layers 658 (in FIG. 7) in the alternating dielectric stack 654 and the staircase structure 657 can be removed through the GLS opening 869 to form lateral tunnels. The lateral tunnels can extend in a lateral direction between adjacent first dielectric layers 656. It is noted that, the term "lateral/laterally" used herein means the plane parallel to the top surface 330f of the substrate 330. The second dielectric layers 658 in the alternating dielectric stack 654 are also referred to as sacrificial layers, and can be removed selectively from between the first dielectric layers 656. In the other words, the etching process of the second dielectric layers 658 can have minimal impact on the first dielectric layers 656. The second dielectric layers 658 can be removed by an isotropic dry etch and/or wet etch. The plasma and/or chemical used in the dry/wet etch can travel vertically and laterally from the GLS opening 869. In some embodiments, the second dielectric layer 658 can be silicon nitride, and the first dielectric layer 656 can be silicon oxide. In this example, the second dielectric layer 658 can be removed by RIE using one or more etchants of $CF_4$, $CHF_3$, $C_4F_8$, $C_4F_6$, and $CH_2F_2$, etc. In some embodiments, the second dielectric layer 658 can be removed using wet etch, such as phosphoric acid.

Next, conductive layers 870 can be disposed inside the lateral tunnels through the GLS opening 869. The conductive layers 870 can be disposed in between adjacent first dielectric layers 656, where the conductive layers 870 and the first dielectric layers 656 can form the film stack 335 of alternating conductive and dielectric layers (as in FIG. 3).

In some embodiments, the conductive layers 870 can be formed by filling the lateral tunnels with a suitable conductive material. The conductive material for the conductive layers 870 can include metal or metal alloys such as tungsten (W), aluminum (Al), titanium (Ti), copper (Cu), cobalt (Co), nickel (Ni), titanium nitride (TiN), tungsten nitride (WN), tantalum (Ta), tantalum nitride (TaN), AlTi, or any combination thereof. In some embodiments, the conductive material for the conductive layers 870 can also include polycrystalline semiconductors, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, arsenic, or any combination thereof. In some embodiments, the conductive layers 870 can also be amorphous semiconductors such as amorphous silicon. In some embodiments, the conductive material can be disposed using a suitable deposition method such as chemical vapor deposition (CVD) (e.g., LPCVD, PECVD, MOCVD, RTCVD, etc.), physical vapor deposition (PVD), sputtering, evaporation, atomic layer deposition (ALD), or any combination thereof. In some embodiments, the conductive layers 870 include tungsten (W) deposited by CVD.

As described above, by replacing the second dielectric layers 658 with the conductive layers 870, the alternating dielectric stack 654 turns into the film stack 335 of alternating conductive and dielectric layers. Accordingly, the channel structures 761 formed in the alternating dielectric stack 654 become the memory strings 212, where the intersessions of the memory strings 212 and the film stack 335 form the vertically stacked memory cells 340. It should be understood that although the film stack 335 here is formed by a replacement method (i.e., replacing the second dielectric layers 658 with conductive layers 870), the film stack 335 can also be formed by other approaches, for example, by disposing the conductive layers 870 and the first dielectric layers 656 directly over the substrate 330.

In some embodiments, a gate dielectric layer 872 can be disposed inside the lateral tunnels, prior to disposing the conductive layers 870. The gate dielectric layer 872 can include any suitable insulator, for example, silicon oxide, silicon nitride, silicon oxynitride, and/or any suitable combinations thereof. The gate dielectric layer 872 can also include high-k dielectric materials, such as hafnium oxide, zirconium oxide, aluminum oxide, tantalum oxide, lanthanum oxide, and/or any combination thereof. The gate dielectric layer 872 can be disposed by one or more suitable deposition processes, such as CVD, PVD, and/or ALD.

In some embodiments, a gate adhesion layer 874 can be disposed on the gate dielectric layer 872, prior to disposing the conductive layers 870. The gate adhesion layer 874 can be used to promote adhesion between the gate dielectric layer 872 and the conductive layers 870. The gate adhesion layer 874 can include, for example, tantalum nitride (TaN) and/or titanium nitride (TiN).

In some embodiments, etching and cleaning processes can be used to remove excess conductive materials on sidewalls of the GLS opening 869. As such, each conductive layer 870 of the film stack 335 can be electrically isolated from each other. In some embodiments, the conductive layers 870 can be recessed back from sidewalls of the GLS opening 869. In some embodiments, excess conductive materials on top of the first capping layer 766 can also be removed, for example, by CMP.

Next, a GLS filler 871 can be disposed inside the GLS opening 869 to form the slit structure 216 (also referred to as GLS), as shown in FIGS. 2-3 and 8. The GLS 216 penetrates vertically through the insulating layer 660, the film stack 335 of alternating conductive and dielectric layers and extends into the substrate 330. The GLS filler 871 can include any suitable insulator, for example, silicon oxide, silicon nitride, silicon oxynitride, boron or phosphorus doped silicon oxide, carbon-doped oxide (CDO or SiOC or SiOC:H), or fluorine doped oxide (SiOF), or any combination thereof. The GLS filler 871 can be deposited by using, for example, ALD, CVD (e.g., PECVD, RTCVD, LPCVD, etc.), PVD, sputtering, evaporating, or any other suitable film deposition techniques. In some embodiments, the GLS filler 871 outside the GLS opening 869 can be removed by etching (e.g., RIE) and/or CMP. As such, the GLS 216 can be coplanar with the first capping layer 766. As discussed previously, the GLS 216 can divide a memory block into multiple functional units (e.g., memory fingers). The GLS 216 can also provide mechanic support in the channel structure region 211.

In some embodiments, a second capping layer 868 can be disposed on the first capping layer 766 to cover the GLS 216. The second capping layer 868 can include silicon oxide, silicon nitride, silicon oxynitride, TEOS, or a combination thereof. The second capping layer 868 can be deposited by CVD, PVD, ALD, sputtering, etc.

Referring to FIG. 4, at process step S445, a through-silicon-via (TSV) can be formed in the peripheral region. A cross-sectional view of an exemplary 3D memory structure 900 is shown in FIG. 9, according to the process step S445.

Figure 9:
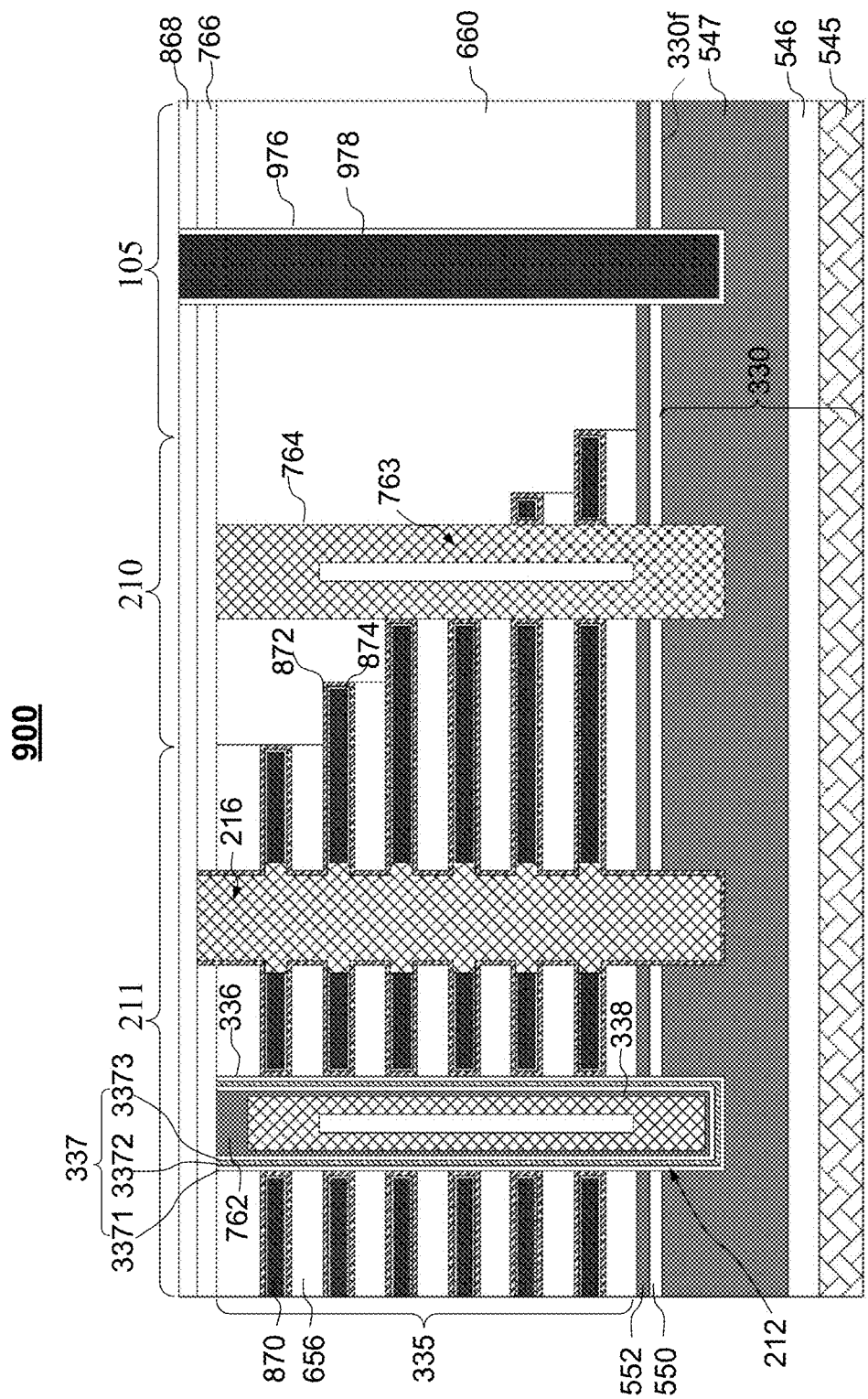

As shown in FIG. 9, the 3D memory structure 900 includes the TSV 976, penetrating vertically through the second capping layer 868, the first capping layer 766 and the insulating layer 660. In some embodiments, the TSV 976 also penetrates through the second etch-stop layer 552 and the first etch-stop layer 550, and extends into the substrate 330 (e.g., the semiconductor layer 547). In some embodiments, one or more of the TSVs 976 can be electrically connected to any of the contact structures 64, conductive lines 66, substrate contact 72 in the peripheral circuitry 600B (shown in FIG. 6B) to provide electrical connections to the peripheral devices 50. The number and layout of the TSVs 976 can be adjusted accordingly and are not limited to the example shown in FIG. 9.

To form the TSV 976, a TSV opening can be formed by lithography and etching. The etching process for the TSV 976 can include dry etch, wet etch and/or a combination thereof. When the insulating layer 660 is silicon oxide, etching silicon oxide can use anisotropic RIE with chemical etchant, for example, $CF_4$, $CHF_3$, $C_2F_6$, $C_3F_6$, and/or any combination thereof. The etching process and chemistry listed here are only examples and should not be so limited. Next, a conductive material can be disposed inside the TSV opening. The TSV 976 can include any suitable conductive material, for example, a metal or metallic compound such as tungsten (W), aluminum (Al), copper (Cu), cobalt (Co), titanium (Ti), tantalum (Ta), titanium nitride (TiN), tantalum nitride (TaN), and/or any combination thereof. The metal or metallic compound can be disposed using a suitable deposition method such as CVD, PVD, ALD, sputtering, evaporation, etc.

In some embodiments, the TSV 976 can have a shape similar to a cylinder, a cuboid, or any other shapes. In some embodiments, prior to disposing the conductive material, a TSV interface layer 978 can be disposed on a sidewall of the TSV opening by a suitable thin film deposition technique, for example, CVD, PVD, ALD, sputtering, etc. The TSV interface layer 978 can include TiN, TaN, etc.

In some embodiments, the forming of the TSV 976 can also include a planarization process, e.g., CMP, to remove excess conductive material on top of the second capping layer 868. As shown in FIG. 9, the TSV 976 can be coplanar with the second capping layer 868.

It should be understood that the channel holes 336 (or memory strings 212), dummy channel holes 764 (or dummy channel structures 763), the GLS 216 and the TSV 976 can have the same or different depths inside the substrate 330.

Referring to FIG. 4, at process step S450, the substrate can be removed, stopping on the first etch-stop layer such that a portion of the memory film extending into the substrate can be exposed. A cross-sectional view of an exemplary 3D memory structure 1000 is shown in FIG. 10, according to the process step S450.

Figure 10:
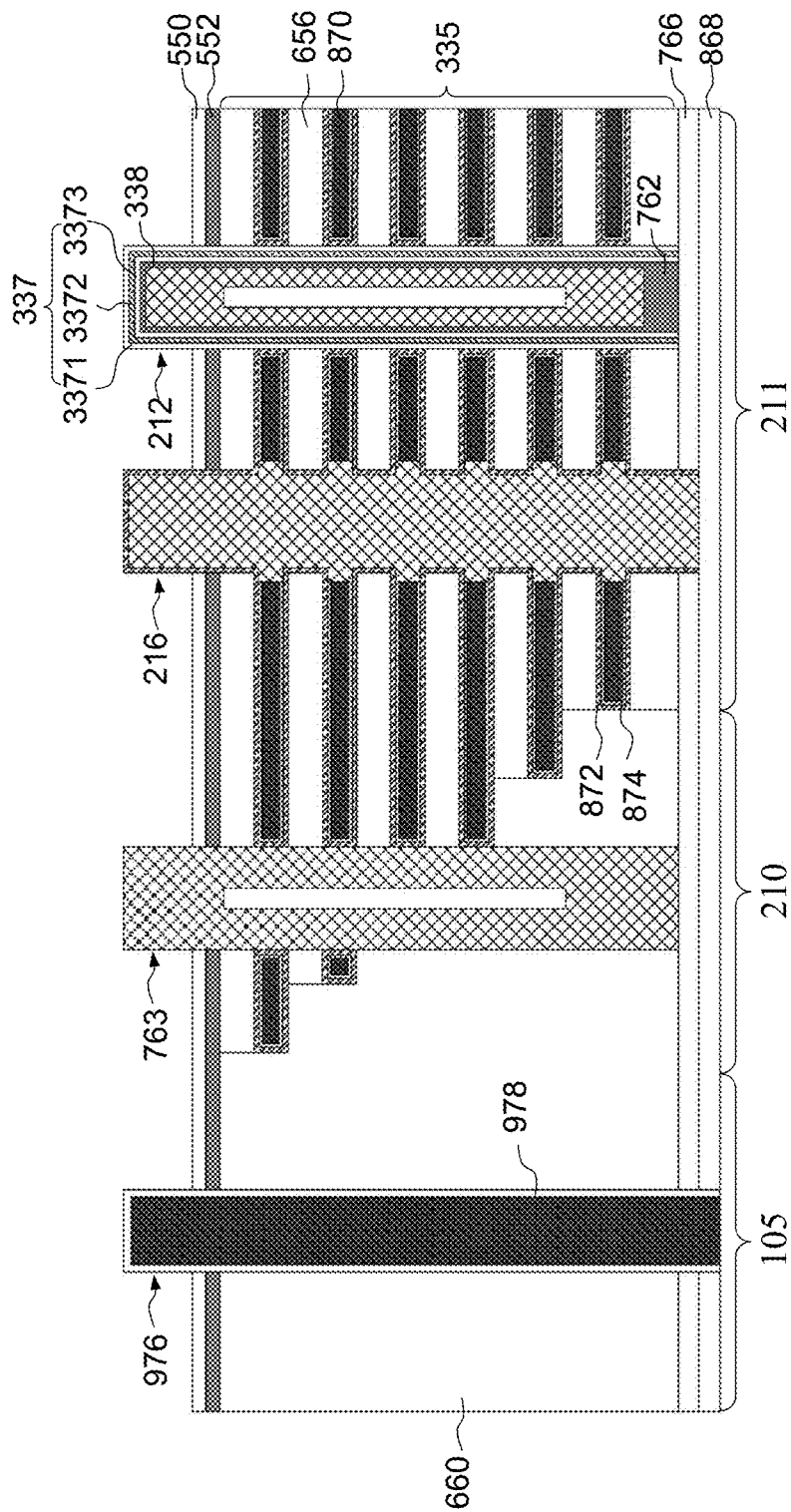

As shown in FIGS. 9 and 10, the 3D memory structure 1000 is a 180° rotation of the 3D memory structure 900, where the substrate 330 can be removed from a backside of the substrate 330 (i.e., a side farther away from the film stack 335, opposite to the front surface 330f). In some embodiments, the handle wafer 545 of the substrate 330 can be removed first, by a process such as wafer grounding, CMP and/or dry/wet etching, stopping on the insulator layer 546. In the other words, the process of removing the handle wafer 545 can be selective to the insulator layer 546. For example, the etching rate of the handle wafer 545 can be much higher than the etching rate of the insulator layer 546. Next, the insulator layer 546 can be removed by, for example, a dry or wet etching process, stopping on the semiconductor layer 547. In the other words, the process of removing the insulator layer 546 can be selective to the semiconductor layer 547. For example, the etching rate of the insulator layer 546 can be much higher than the etching rate of the semiconductor layer 547. Subsequently, the semiconductor layer 547 can be removed by a dry or wet etching process, stopping on the first etch-stop layer 550. In the other words, the process of removing the semiconductor layer 547 can be selective to the first etch-stop layer 550. For example, the etching rate of the semiconductor layer 547 can be much higher than the etching rate of the first etch-stop layer 550.

In some embodiments, the process of removing the substrate 330 and/or removing the semiconductor layer 547 can also be selective to the memory film 337 (e.g., the blocking layer 3371) of the memory string 212. Accordingly, a portion of the memory film 337 (e.g., blocking layer 3371) extending into the substrate 330 can be exposed after removing the substrate 330. The memory string 212 having the exposed portion of the memory film 337 protrudes out of the first etch-stop layer 550 from a backside of the film stack 335

(i.e., a side of the film stack 335 closer to the substrate 330 or the first etch-stop layer 550). Similarly, a portion of the TSV 976, a portion of the dummy channel structure 763, and a portion of the GLS 216, which extend into the substrate 330, can be exposed from the backside of the film stack 335 after removing the substrate 330.

By adding etch-stop layers and using selective etching process, process uniformity for removing the substrate can be greatly improved.

Referring to FIG. 4, at process step S455, the first etch-stop layer and the exposed portion of the memory film can be removed to expose a portion of the channel layer. A cross-sectional view of an exemplary 3D memory structure 1100 is shown in FIG. 11, according to the process step S455.

Figure 11:
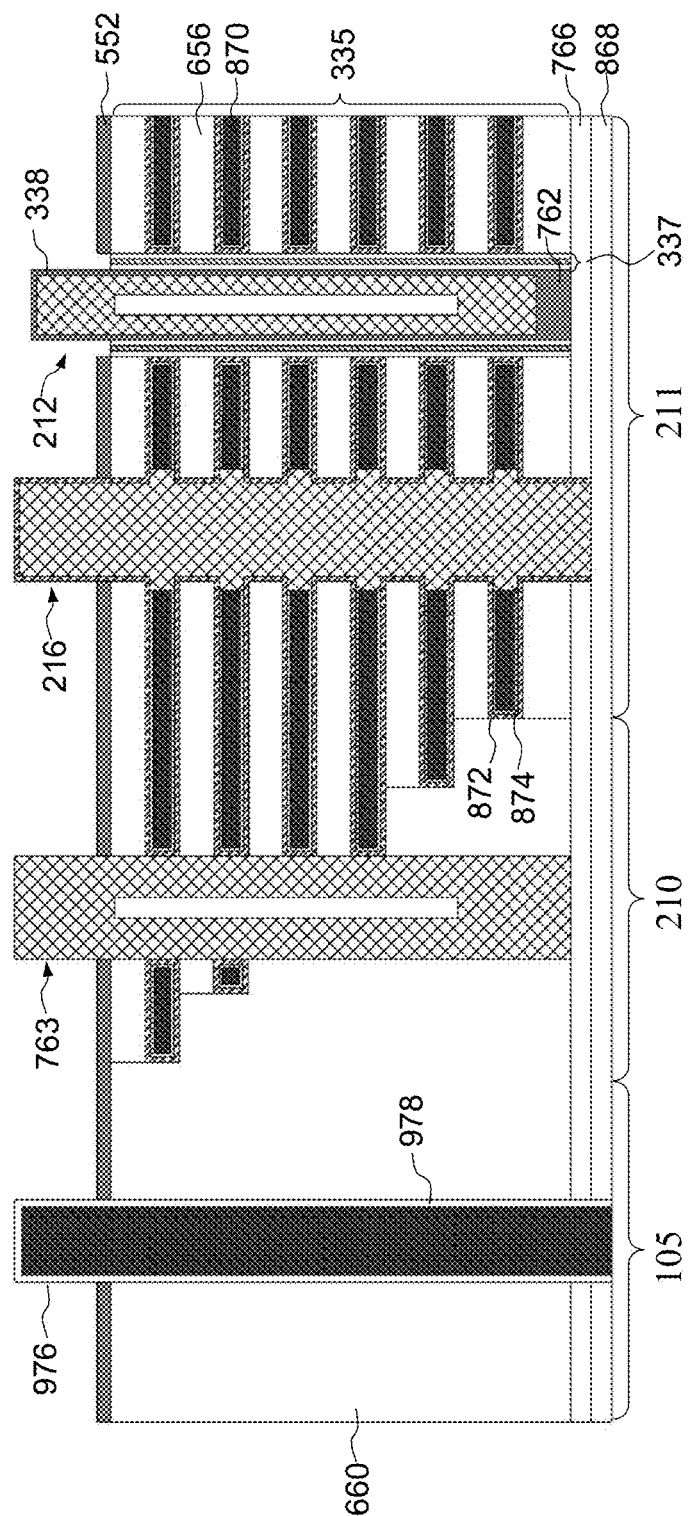

As shown in FIGS. 10 and 11, the first etch-stop layer 550 can be removed from the 3D memory structure 1000 to form the 3D memory structure 1100. The first etch-stop layer 550 can be removed by, for example, a dry or wet etching process, where the etching process can be stopped at the second etch-stop layer 552. In the other words, the process of removing the first etch-stop layer 550 can be selective to the second etch-stop layer 552. For example, the etching rate of the first etch-stop layer 550 can be much higher than the etching rate of the second etch-stop layer 552.

In some embodiments, the etching process of the first etch-stop layer 550 can also remove the exposed portion of the memory film 337 (i.e., the portion extending into the substrate 330) and can also be selective to the channel layer 338 of the memory string 212. In the other words, the exposed portion of the memory film 337 can be removed stopping on the underlying channel layer 338. For example, the etching rate of the memory film 337 can be much higher than the etching rate of the channel layer 338. As such, a portion of the channel layer 338 of the memory string 212 can be exposed from the backside of the film stack 335.

In some embodiments, the memory film 337 can be further pulled back (or recessed) into the film stack 335 such that the exposed portion of the channel layer 338 from the backside of the film stack 335 can be larger.

In some embodiments, the etching process of the first etch-stop layer 550 and the memory film 337 can also be selective to the dummy channel structure 763, the GLS 216 and the TSV 976. Accordingly, a portion of the dummy channel structure 763, a portion of the GLS 216 and a portion of the TSV 976 can be exposed from the backside of the film stack 335. The exposed portion of the dummy channel structure 763, the exposed portion of the GLS 216 and the exposed portion of the TSV 976 protrudes out of the second etch-stop layer 552 from the backside of the film stack 335.

By implementing the second etch-stop layer 552, the exposed portion of the memory film 337 can be removed controllably from the backside of the film stack without affecting the underlying film stack 335. Uniformity of the exposed portion of the channel layer 338 can also be improved. By controllably recessing the memory film 337 below the second etch-stop layer 552 (i.e., into the film stack 335), the exposed portion of the channel layer 338 can be controlled.

Referring to FIG. 4, at process step S460, an array common source (ACS) can be formed on a backside of the second etch-stop layer. A cross-sectional view of an exemplary 3D memory structure 1200 is shown in FIG. 12, according to the process step S460.

Figure 12:
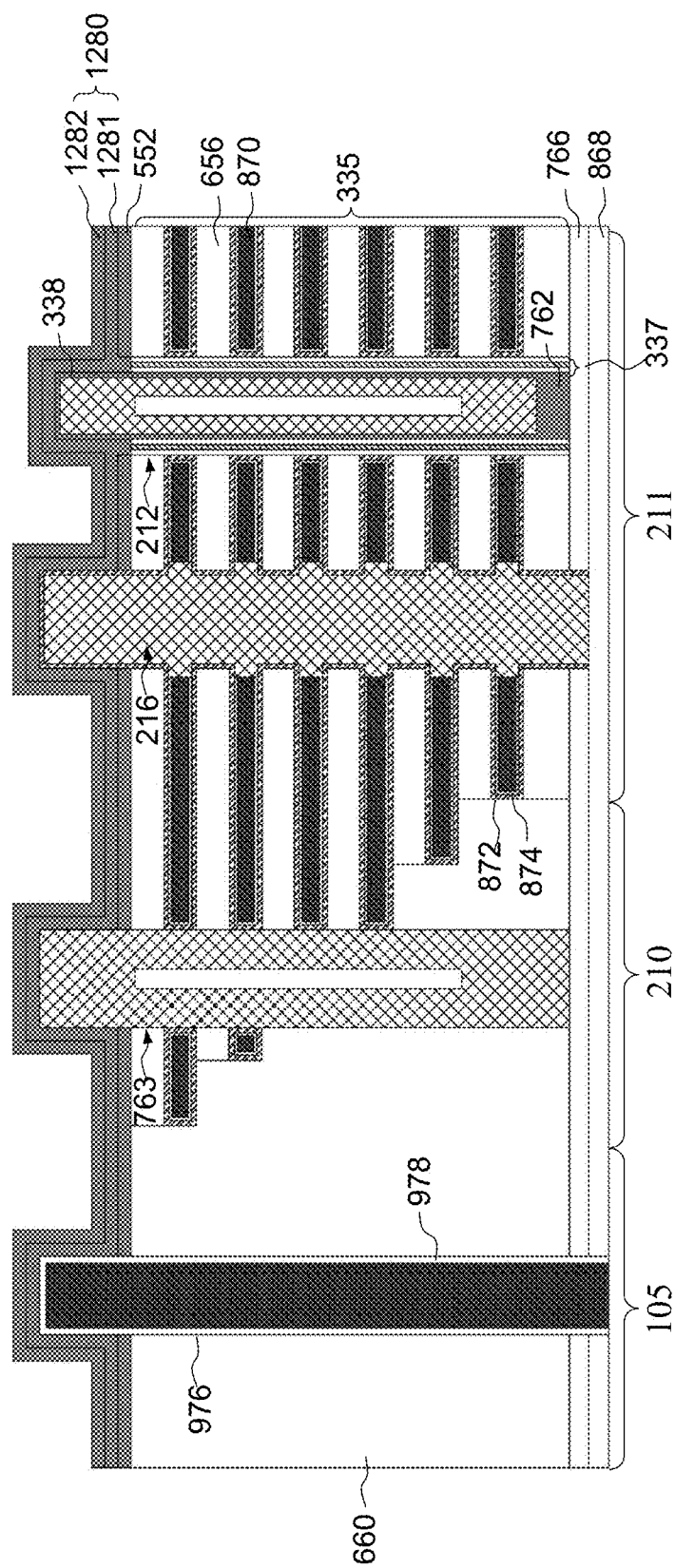

As shown in FIG. 12, the 3D memory structure 1200 includes an ACS 1280 disposed on a backside of the second etch-stop layer 552, where the backside of the second etch-stop layer 552 is a side farther away from the film stack 335. In some embodiments, the ACS 1280 includes one or more polycrystalline silicon layers.

As illustrated in FIG. 12, the ACS 1280 includes a first polycrystalline silicon layer 1281 and a second polycrystalline silicon layer 1282. A thin film deposition process such as CVD, PVD, ALD, sputtering, evaporation, or any combination thereof can be used to deposit the first polycrystalline silicon layer 1281 on the backside of the second etch-stop layer 552, covering exposed portions of the memory string 212, the GLS 216, the dummy channel structure 763 and the TSV 976. Next, the first polycrystalline silicon layer 1281 can be doped with p-type or n-type dopants using, for example, an ion implantation process, followed by an annealing process (e.g., laser anneal, rapid thermal anneal, etc.) to activate the dopants and reduce defects caused by the ion implantation process. Similarly, the second polycrystalline silicon layer 1282 can be disposed on the first polycrystalline silicon layer 1281 from the backside using similar techniques (e.g., implantation and annealing). The second polycrystalline silicon layer 1282 can have different dopants and/or dopant concentration from the first polycrystalline silicon layer 1281. In some embodiments, the ACS 1280 can include one or more polycrystalline silicon layers in-situ doped during deposition (e.g., CVD, PVD, ALD, etc.).

In the 3D memory structure 1200, the ACS 1280 contacts the exposed portion of the channel layer 338, and thereby can provide electrical connections to the channel layer 338 of the memory string 212. As discussed previously, the exposed portion of the channel layer 338 can be increased by recessing the memory film 337. The contact area between the ACS 1280 and the channel layer 338 can also be increased. Therefore, contact resistance between the ACS 1280 and the channel layer 338 of the memory string 212 can be reduced and performance of the of 3D memory can be improved. It is noted that the ACS can contact the channel layers 338 of a plurality of memory strings 212. In some embodiments, the ACS can provide electrical connections to all the memory strings 212 in the same memory block. In some embodiments, the ACS 1280 can also cover the exposed portions of the dummy channel structure 763, the GLS 216 and the TSV 976.

In some embodiments, the second etch-stop layer 552 can also be used as a spacer between the film stack 335 and the ACS 1280. By adjusting the thickness of the second etch-stop layer 552, the distance between the ACS 1280 and the conductive layers 870 (i.e., word lines 333 as in FIG. 3) can be effectively controlled.

Referring to FIG. 4, at process step S465, a dielectric filling layer can be disposed on a backside of the ACS. A cross-sectional view of an exemplary 3D memory structure 1300 is shown in FIG. 13, according to the process step S465.

Figure 13:
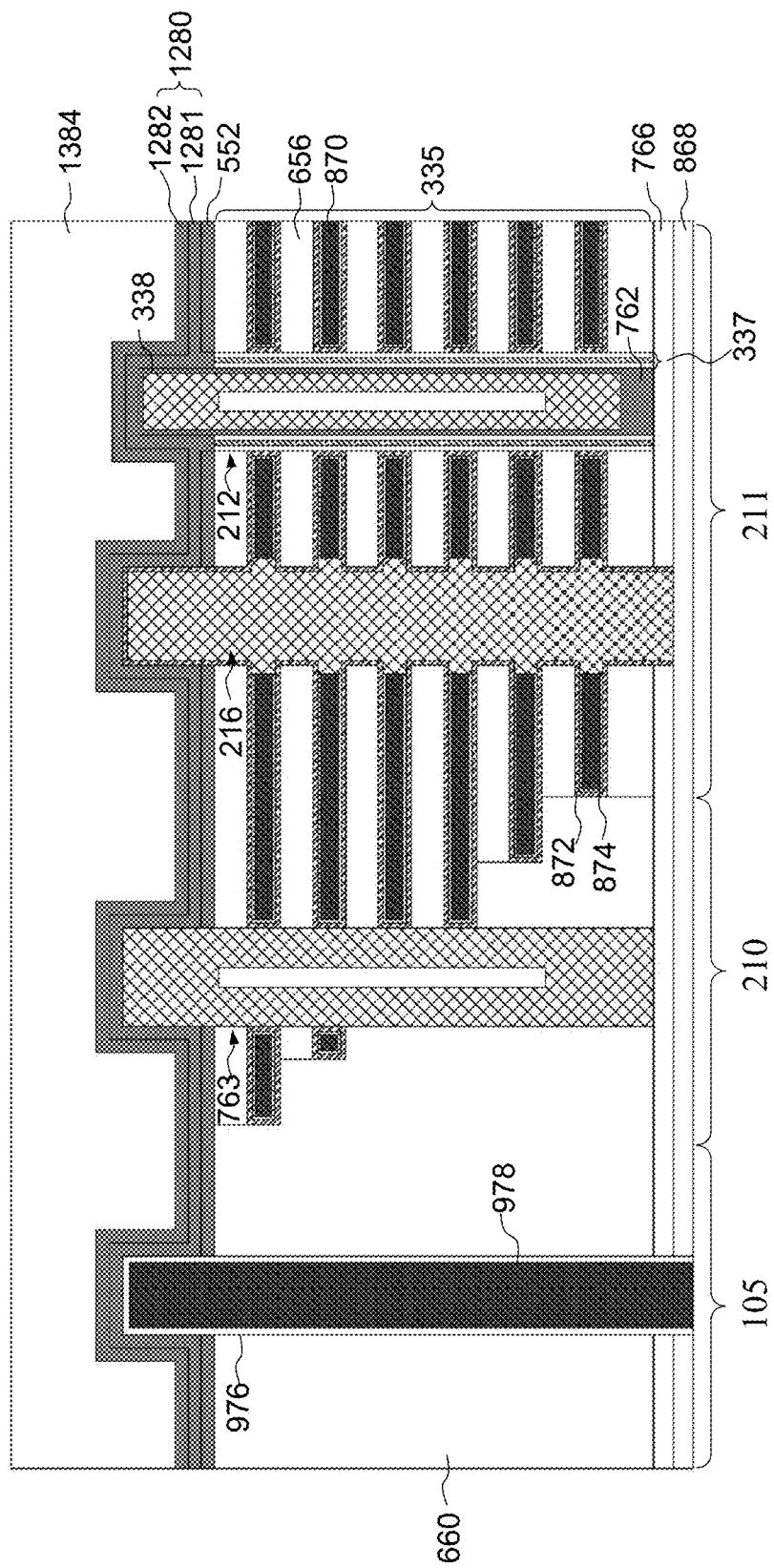

As shown in FIG. 13, the dielectric filling layer 1384 can be disposed on a backside of the ACS 1280 (i.e., a side farther away from the film stack 335). The dielectric filling layer 1384 can be disposed by any suitable thin film deposition technique, for example, CVD (e.g., a high-density plasma chemical vapor deposition), PVD, ALD, sputtering, evaporation, or a combination thereof. The dielectric filling layer 1384 can include silicon oxide, silicon nitride, silicon oxynitride, TEOS, etc. In some embodiments, a CMP process may be used to planarize a backside surface of the dielectric filling layer 1384 (a side away from the film stack 335).

Referring to FIG. 4, at process step S470, a first contact opening and a second contact opening can be formed in the dielectric filling layer to expose the ACS and the TSV, respectively. A cross-sectional view of an exemplary 3D memory structure 1400 is shown in FIG. 14, according to the process step S470.

Figure 14:
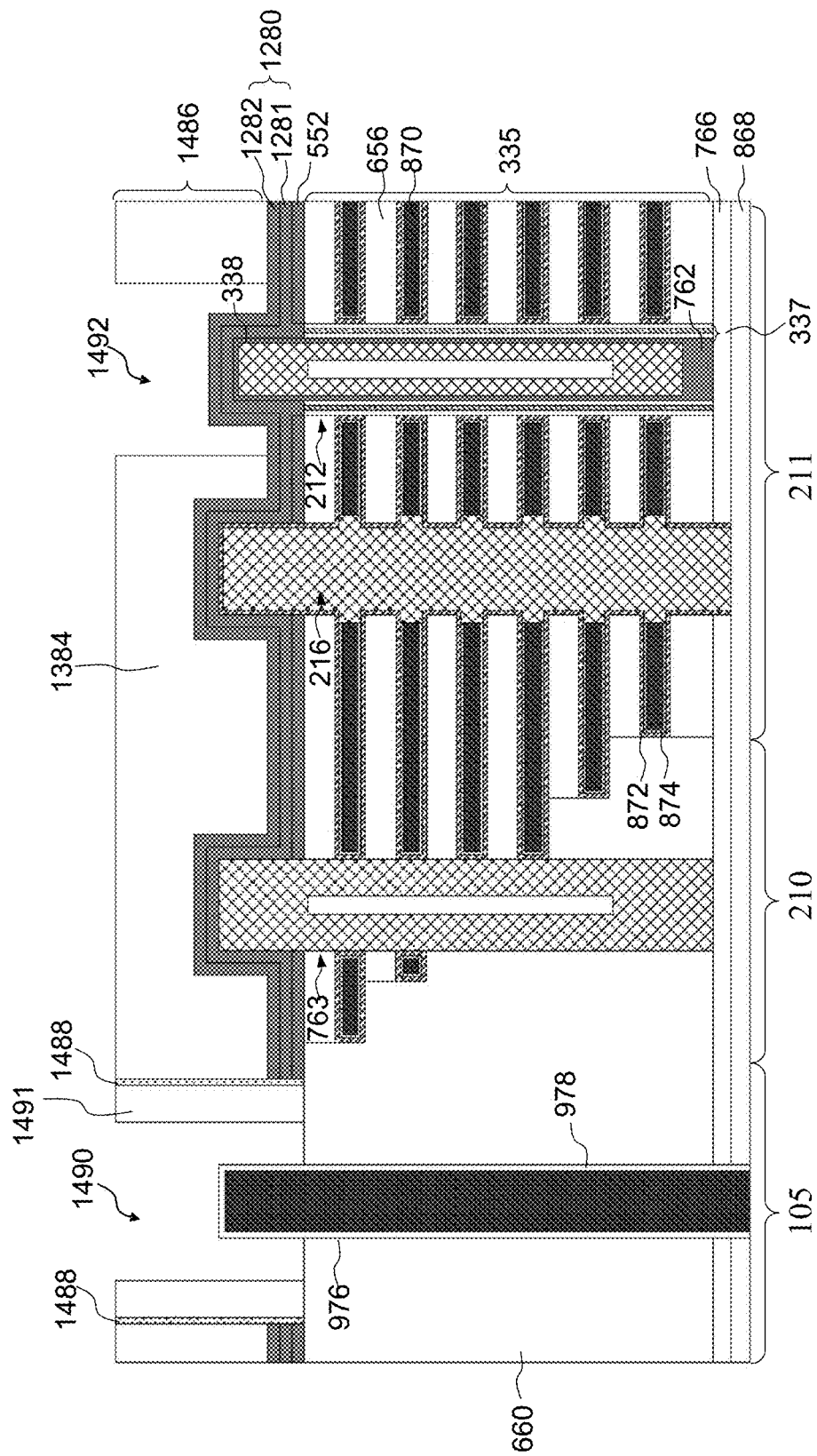

As shown in FIG. 14, the 3D memory structure 1400 includes a first contact opening 1490 formed in the dielectric filling layer 1384 to expose at least a portion of the ACS 1280. The first contact opening 1490 penetrates through the dielectric filling layer 1384 and the ACS 1280. In some embodiments, the first contact opening 1490 further penetrates through the second etch-stop layer 552 into the insulating layer 660. The first contact opening 1490 exposes the TSV 976 from the backside of the film stack 335 and removes a portion of the ACS 1280 surrounding the TSV 976 to electrically isolate the TSV 976 from the ACS 1280. The first contact opening 1490 can be formed by a lithography and an etching process that includes a dry or wet etching.

In some embodiment, an isolation spacer 1491 can be formed on a sidewall of the first contact opening 1490. The isolation spacer 1491 can include any suitable insulating material, for example, silicon oxide, silicon nitride, silicon oxynitride, TEOS, etc. The isolation spacer 1491 can be formed by thin film deposition (e.g., CVD, PCV, ALD, sputtering, etc.) and an anisotropic etching (e.g., RIE).

The 3D memory structure 1400 also includes a second contact opening 1492 formed in the dielectric filling layer 1384. The second contact opening 1492 penetrates through the dielectric filling layer 1384 to expose the ACS 1280. The second contact opening 1492 can be formed by a lithography and an etching process that includes a dry or wet etching. Different from the first contact opening 1490, the etching process for the second contact opening 1492 does not remove the ACS 1280. In some embodiments, the first contact opening 1490 and the second contact opening 1492 can be formed sequentially through different lithograph and etching processes. In some embodiments, the first contact opening 1490 can be formed before the second contact opening 1492, or vice versa. It is noted that FIG. 14 only illustrates one first contact opening 1490 and one second contact opening 1492. However, the number and arrangement of the first contact opening 1490 and the second contact opening 1492 are not so limited and can be any suitable number or arrangement as needed.

After forming the first contact opening 1490 and the second contact opening 1492 in the dielectric filling layer 1384, an interlayer dielectric (ILD) layer 1486 can be formed. The ILD layer 1486 (also called "inter-metal dielectric (IMD) layer") can include one or more insulating material (e.g., silicon oxide, silicon nitride, silicon oxynitride, TEOS, polyimide, spin-on-glass, etc.), which can provide insulation for metal interconnections formed in the subsequent processes.

In some embodiments, the ILD layer 1486 also includes a backside deep trench isolation (BDTI) 1488. The BDTI 1488 can include any suitable dielectric material, for example, silicon oxide, silicon nitride, silicon oxynitride, TEOS, etc. In some embodiments, BDTI 1488 can also include a dielectric material different from the dielectric filling layer 1384 and the isolation spacer 1491, for example, a high dielectric constant material (high-k dielectric).

In some embodiments, the BDTI 1488 can be deposited on the sidewall of the first contact opening 1490, prior to depositing the isolation spacer 1491. In this example, the BDTI 1488 can be formed by thin film deposition followed by an anisotropic etching. In some embodiments, the BDTI 1488 can be formed anywhere in the dielectric filling layer 1384. The BDTI 1488 can penetrate through the dielectric filling layer 1384 and the ACS 1280, and can further extend into the insulating layer 660. In this example, the BDTI 1488 can be formed by an etching process (e.g., dry/wet etching) followed by a thin film deposition process (e.g., CVD, PVD, ALD, etc.). The BDTI 1488 can have a coplanar surface with the ILD layer 1486 on a backside (a side away from the film stack 335) through a planarization process (e.g., CMP).

Referring to FIG. 4, at process step S475, a backside interconnect layer with an ACS contact structure and a TSV contact structure can be formed on a backside of the ILD layer. A cross-sectional view of an exemplary 3D memory structure 1500 is shown in FIG. 15, according to the process step S475.

Figure 15:
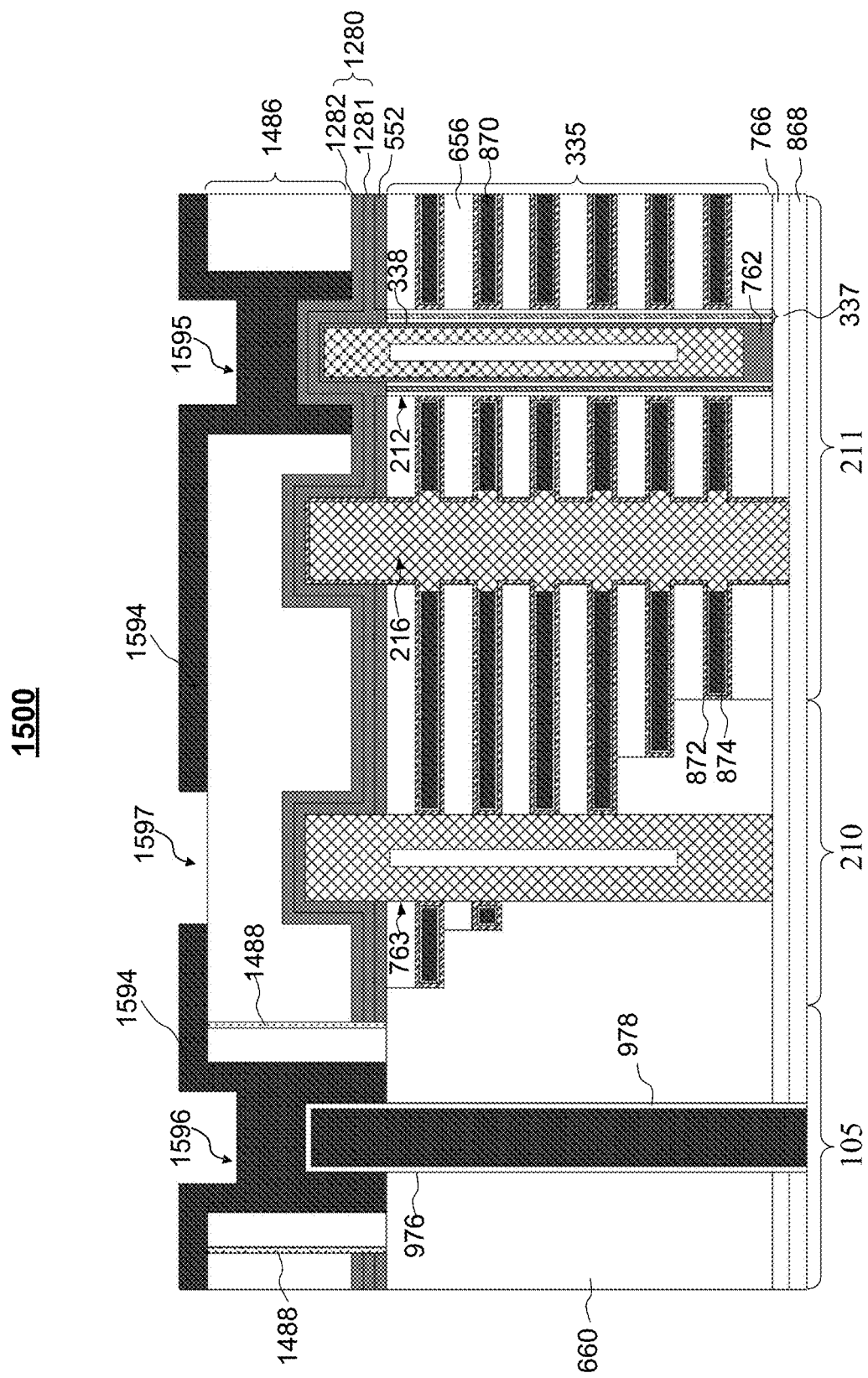

As shown in FIG. 15, the 3D memory structure 1500 includes a backside interconnect layer 1594 having an ACS contact structure 1595 and a TSV contact structure 1596. The backside interconnect layer 1594 can be form on the backside of the ILD layer 1486, a side farther away from the film stack 335. The backside interconnect layer 1594 can include any suitable conductive material, for example, a metal or metal alloy such as tungsten (W), cobalt (Co), copper (Cu), titanium (Ti), tantalum (Ta), aluminum (Al), titanium nitride (TiN), tantalum nitride (TaN), nickel, silicides ($WSi_x$, $CoSi_x$, $NiSi_x$, $AlSi_x$, etc.), or any combination thereof. The conductive material can be deposited by one or more thin film deposition processes such as CVD, PVD, ALD, sputtering, plating, evaporation, or any combination thereof. After disposing the conductive material inside the first contact opening 1490 and the second contact opening 1492 (in FIG. 14), the conductive material can be patterned to form the ACS contact structure 1595 and the TSV contact structure 1596 with an isolation spacing 1597 in between the contact structures through processes such as lithography, etching, planarization (e.g., CMP), etc.

The ACS contact structure 1595 can provide electrical connections to the channel layers 338 of the memory strings 212 from the backside of the ACS 1280 (a side farther away from the film stack 335). Connections for the ACS 1280 drawn from the backside can save area and thereby increase storage capacity of the 3D memory.

The TSV contact structure 1596 can provide electrical connections to the TSV 976 from the backside of the ILD layer 1486 (a side farther away from the film stack 335). As discussed previously, the TSV 976 can provide electrical connections to the peripheral devices 50 in the peripheral circuitry 600B through contact structures 64 and/or conductive lines 66 (see FIG. 6B). Accordingly, electrical connections to the peripheral devices can be wired from the backside of the ILD layer 1486. Similarly, connections for the peripheral devices drawn from the backside can save area and thereby increase storage capacity of the 3D memory.

In some embodiments, the isolation spacing 1597 can be formed through a dry/wet etching process to disconnect the ACS contact structure 1595 and the TSV contact structure 1596. In some embodiments a dielectric material can be disposed inside the isolation spacing 1597 to further avoid crosstalk between the ACS contact structure 1595 and the TSV contact structure 1596 when receiving and transmitting signals, where the dielectric material can be silicon oxide, silicon nitride, silicon oxynitride, TEOS, polyimide, spin-on-glass, etc., and can be disposed by any suitable process such as CVD, PVD, ALD, sputtering, evaporation, spinning-on, etc.

In some embodiments, the backside interconnect layer 1594 (including the TSV contact structure 1596 and the ACS contact structure 1595) can be coplanar with the ILD layer 1486 through a planarization process (e.g., CMP). In this example, the backside interconnect layer 1594 can be embedded or recessed inside the ILD layer 1486.

The present disclosure also provide a 3D memory device fabricated using the method 400 discussed above.

Figure 16:
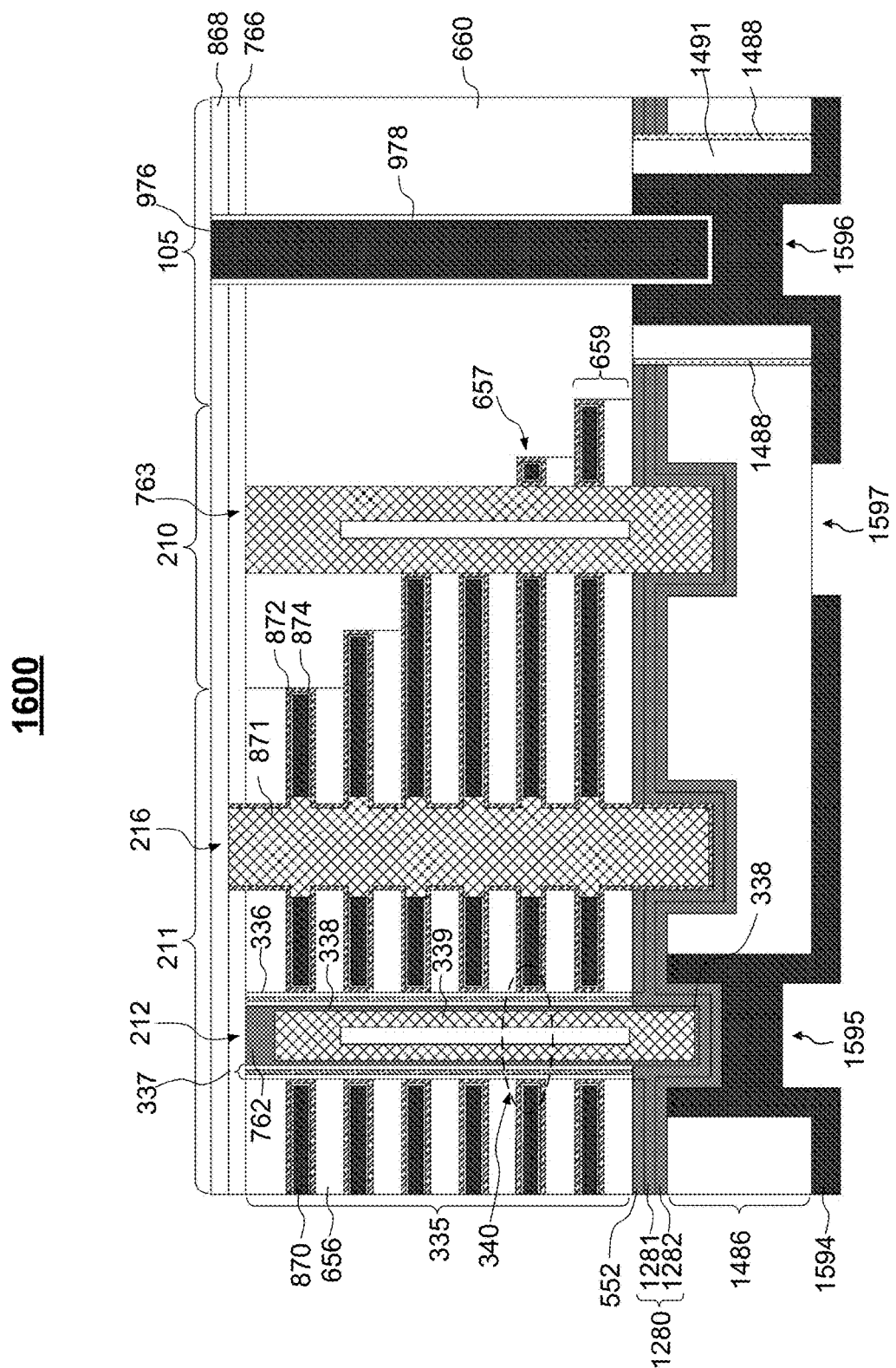

FIG. 16 illustrates a 3D memory device 1600, according to some embodiments of the present disclosure. The 3D memory device 1600 includes the film stack 335 of alternating conductive and dielectric layers, the ILD layer 1486 and the ACS 1280 located in between the film stack 335 and the ILD layer 1486.

The film stack 335 includes the conductive layers 870 and the first dielectric layers 656 alternatingly stacked in a vertical direction. The first dielectric layer 656 includes any suitable insulating materials, for example, silicon oxide, silicon oxynitride, silicon nitride, TEOS or silicon oxide with F-, C-, N-, and/or H-incorporation. The first dielectric layers 656 can have the same thickness or different thicknesses, which can be in a range between 10 nm to 500 nm. In some embodiments, the first dielectric layer 656 can be silicon oxide with a thickness about 25 nm. The conductive layers 870 include any suitable metal or metal alloys such as tungsten (W), aluminum (Al), titanium (Ti), copper (Cu), cobalt (Co), nickel (Ni), titanium nitride (TiN), tungsten nitride (WN), tantalum (Ta), tantalum nitride (TaN), AlTi, or any combination thereof. The conductive layers 870 can have the same thickness or different thicknesses, which can be in a range between 10 nm to 500 nm. In some embodiments, the conductive layers 870 include W with a thickness about 35 nm.

The film stack 335 can also include the gate dielectric layer 872 surrounding the conductive layer 870. The gate dielectric layer 872 can include any suitable insulator, for example, silicon oxide, silicon nitride, silicon oxynitride, and/or any suitable combinations thereof. The gate dielectric layer 872 can also include high-k dielectric materials, such as hafnium oxide, zirconium oxide, aluminum oxide, tantalum oxide, lanthanum oxide, and/or any combination thereof. In some embodiments, the film stack 335 can also include the gate adhesion layer 874 sandwiched in between the gate dielectric layers 872 and the conductive layers 870. The gate adhesion layer 874 can be used to promote adhesion between the gate dielectric layer 872 and the conductive layers 870. The gate adhesion layer 874 can include, for example, tantalum nitride (TaN) and/or titanium nitride (TiN).

The 3D memory device 1600 also include the staircase structure 657, formed in the film stack 335 in the staircase region 210. The staircase structure 657 includes a plurality of staircase steps 659. The staircase step 659, or a "staircase layer", refers to a layer stack with the same lateral dimension, parallel to the conductive layers 870 and the first dielectric layers 656. Each of the staircase steps 659 terminates at a shorter length than the staircase step underneath.

The 3D memory device 1600 also includes the insulating layer 660 disposed on the staircase structure 657 and the film stack 335. The insulating layer 660 can be also disposed over the ACS 1280 in the peripheral region 105. The insulating layer 660 includes silicon oxide, silicon oxynitride, silicon nitride, TEOS, spin-on-glass, low-k dielectric material, such as carbon-doped oxide (CDO or SiOC or SiOC:H), or fluorine doped oxide (SiOF), etc. In some embodiments, the insulating layer 660 can have a planar surface over the staircase structure 657 in the staircase region 210, the film stack 335 in the channel structure region 211, and the ACS 1280 in the peripheral region 105.

The 3D memory device 1600 also includes a plurality of memory strings 212 in the channel structure region 211, wherein the memory strings 212 vertically penetrate through the film stack 335. In some embodiments, the memory strings extend into the ACS 1280 and the ILD layer 1486. In some embodiments, the memory strings 212 can have a cylindrical shape. The memory string 212 can include the core filling film 339 in a center, where the core filling film 339 can be surrounded by the channel layer 338. The core filling film 339 can include any suitable insulator, for example, silicon oxide, silicon nitride, silicon oxynitride, spin-on-glass, boron or phosphorus doped silicon oxide, carbon-doped oxide (CDO or SiOC or SiOC:H), fluorine doped oxide (SiOF), or any combination thereof. The channel layer 338 can include any suitable semiconductor such as polycrystalline silicon with a thickness in a range from about 10 nm to about 30 nm. The memory string 212 can also include the memory film 337 covering a sidewall of the channel layer 338, i.e., surrounding the channel layer 338. The memory film 337 can be a composite layer including a tunneling layer, a storage layer (also known as "charge trap/storage layer"), and a blocking layer. In some embodiments, the tunneling layer, the storage layer, and the blocking layer are arranged along a direction from a center of the memory string 212 toward the outer of the memory string 212 in the above order. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the memory film 337 includes ONO dielectrics (e.g., a tunneling layer including silicon oxide, a storage layer including silicon nitride, and a blocking layer including silicon oxide). In some embodiments, a thickness of the memory film 337 can be in a range from about 10 nm to about 50 nm. The 3D memory device 1600 includes a plurality of vertically stacked memory cells 340. The memory cell 340 is formed at an intersection between the conductive layer 870 and the memory string 212. The conductive layers 870 can form the word lines 333 in FIG. 3 to address the memory cells 340.

In some embodiments, the memory string 212 also include an epitaxial plug (not shown in FIG. 16) at bottom of the memory string 212 (closer to the ACS 1280). The epitaxial plug can include any suitable semiconductor material, such as silicon, silicon germanium, germanium, gallium arsenide, gallium nitride, III-V compound, or any combination thereof. In some embodiments, the epitaxial plug can also include a polycrystalline semiconductor material, for example, polycrystalline silicon. The epitaxial plug can be connected to the channel layer 338 of the memory string 212.

In some embodiments, the memory string 212 can also include the channel top plug 762, configured to provide electrical contact to the channel layer 338. Bit lines (not shown) of the 3D memory device 1600 can address the memory cells 340 through the channel top plug 762. The channel top plug 762 can be amorphous or polycrystalline silicon, and can include metal, metal alloy and/or metal silicide, for example, tungsten, titanium, tantalum, tungsten nitride, titanium nitride, tantalum nitride, nickel silicide, cobalt silicide, tungsten silicide, titanium silicide, or a combination thereof.

The 3D memory device 1600 also includes the GLS 216 penetrating vertically through the film stack 335. In some embodiments, the GLS 216 extends further into the ACS 1280 and the ILD layer 1486. The GLS 216 can include the GLS filler 871, where the GLS filler 871 can include any suitable insulating material, for example, silicon oxide, silicon nitride, silicon oxynitride, TEOS, etc.

In some embodiments, the 3D memory device 1600 also includes the dummy channel structure 763 in the staircase region 210. The dummy channel structure 763 extends vertically through the insulating layer 660 and the staircase structure 657. In some embodiments, the dummy channel structure 763 extends into the ACS 1280 and the ILD layer 1486. The dummy channel structure 763 can be configured to provide mechanical support for 3D memory device 1600 during various fabrication processes. The dummy channel structure 763 can include an insulating material, for example, silicon oxide, silicon nitride, silicon oxynitride, TEOS, high-k dielectric material ($Al_2O_3$, $HfO_2$, $Ta_2O_3$, $ZrO_2$, $La_2O_3$, etc), or any combination thereof.

The 3D memory device 1600 further includes the TSV 976, penetrating through the insulating layer 660. In some embodiments, the TSV 976 extends through the ACS 1280 into the ILD layer 1486. The TSV 976 can include any suitable conductive material, for example, a metal or metal alloy such as tungsten, titanium, tantalum, tungsten nitride, titanium nitride, tantalum nitride, nickel silicide, cobalt silicide, tungsten silicide, titanium silicide, or a combination thereof. In some embodiments, TSV 976 can be configured to provide electric connections to peripheral devices in the peripheral region.

The ACS 1280 includes one or more polycrystalline silicon layers (e.g., the first polycrystalline silicon layer 1281 and the second polycrystalline silicon layer 1282). The one or more polycrystalline silicon layers can be doped with n-type or p-type dopants. The ACS 1280 is in contact with the channel layer 338 of the memory string 212. The ACS 1280 surrounds a portion of the memory string 212 that extend into the ILD layer 1486, where the memory film 337 is removed from this portion of the memory string 212 and thereby the ACS 1280 is in contact with the channel layer 388. In the other words, the memory film 337 covers a first portion of the channel layer 388 and the ACS 1280 covers a second portion of the channel layer 388. The contact area between the channel layer 388 and the ACS 1280 can be increased by further pulling back the memory film 337 away from the ACS 1280 (or towards the film stack 335). As such, contact resistance between the ACS 1280 and the channel layer 388 can be reduced and performance of the 3D memory device 1600 can be improved.

Similarly, the ACS 1280 can also surround a portion of the GLS 216 that extend into the ILD layer 1486. The ACS 1280 can also surround a portion of the dummy channel structure 763 that extend into the ILD layer 1486. In some embodiments, the ACS 1280 is distant from the TSV 976 with electrical isolations provided by the isolation spacer 1491 and/or the BDTI 1488. The ACS 1280 can provide mechanical support for the film stack 335.

The 3D memory device 1600 further includes the backside interconnect layer 1594 formed on the backside of the ACS 1280, a side farther away from the film stack 335. The backside interconnect layer 1594 includes the ACS contact structure 1595 and the TSV contact structure 1596, where the isolation spacing 1597 can be formed in between ACS the contact structure 1595 and the TSV contact structure 1596. The backside interconnect layer 1594 includes any suitable conductive material, for example, a metal or metal alloy such as tungsten (W), cobalt (Co), copper (Cu), titanium (Ti), tantalum (Ta), aluminum (Al), titanium nitride (TiN), tantalum nitride (TaN), nickel, or silicides ($WSi_x$, $CoSi_x$, $NiSi_x$, $AlSi_x$, etc.), or any combination thereof. The ACS contact structure 1595 contacts the ACS 1280 and the TSV contact structure 1596 contacts the TSV 976. The ACS contact structure 1595 can provide electrical connections to the channel layers 388 of the memory strings 212 through the ACS 1280. The TSV contact structure 1596 can provide electrical connections to peripheral devices through the TSV 976.

The ILD layer 1486 includes one or more insulating material such as silicon oxide, silicon nitride, silicon oxynitride, TEOS, polyimide, spin-on-glass, etc., which can provide insulations for the backside interconnect layer 1594. The ILD layer 1486 can include the isolation spacer 1491 and the BDTI 1488. The BDTI 1488 can include any suitable dielectric material, for example, silicon oxide, silicon nitride, silicon oxynitride, TEOS, etc. In some embodiments, BDTI 1488 can also include a dielectric material different from the isolation spacer 1491, for example, a high dielectric constant material (high-k dielectric).

In some embodiments, the 3D memory device 1600 also includes the second etch-stop layer 552 located in between the film stack 335 and the ACS 1280. In some embodiments, the second etch-stop layer 552 can also be disposed in between the insulating layer 660 and the ACS 1280. The distance between the film stack 335 and the ACS 1280 can be determined by the thickness of the second etch-stop layer 552.

In some embodiments, the 3D memory device 1600 also includes the first capping layer 766 and the second capping layer 868 disposed on the front side of the insulating layer 660 over the memory string 212, the GLS 216 and the dummy channel structure 763. The front side of the insulating layer is a side away from the ACS 1280 and the ILD layer 1486. In some embodiments, the memory string 212 and the dummy channel structure 763 are coplanar with the insulating layer 660. In some embodiments, the GLS 216 is coplanar with the first capping layer 766. In some embodiments, the TSV 976 is coplanar with the second capping layer 868.

As described above, the channel layer 338 of the memory string 212 can be connected through the ACS contact structure 1595 on the backside of the film stack 335, which can be referred to as a source terminal. The channel layer 338 of the memory string 212 can also be connected through the channel top plug 762 on the front side of the film stack 335, which can be referred to as a drain terminal. While the drain terminal of the memory string 212 can be connected to a bit line, the source terminals of the memory strings 212 in the same memory block (or sub-block) can be connected together through the ACS 1486. The ACS contact structure 1595 through the backside of the film stack 335 can save area and increase storage capacity for the 3D memory device 1600.

Traditionally, the memory film 337 at the bottom of the channel hole 336 need to be removed in order to form electrical connection to the channel layer 338 from the bottom of the memory string 212 (at the source terminal). By removing the memory film 337 and providing electrical contact for the channel layer 338 from the backside via the ACS contact structure 1595, etching memory film 337 from the bottom of the channel hole 336 having a high aspect ratio can be avoided. In addition, filling some of the GLS 216 with a conductive material to provide electrical connections to the ACS 1280 can also be avoided. As such, leakage path from the conductive layers 870 to the GLS 216 filled with conductive material can be eliminated. Also, by using the first etch-stop layer 550 and the second etch-stop layer 552, the substrate 330 and the memory film 337 can be removed controllably from the backside. Process uniformity and yield can be greatly improved.

Figure 17:
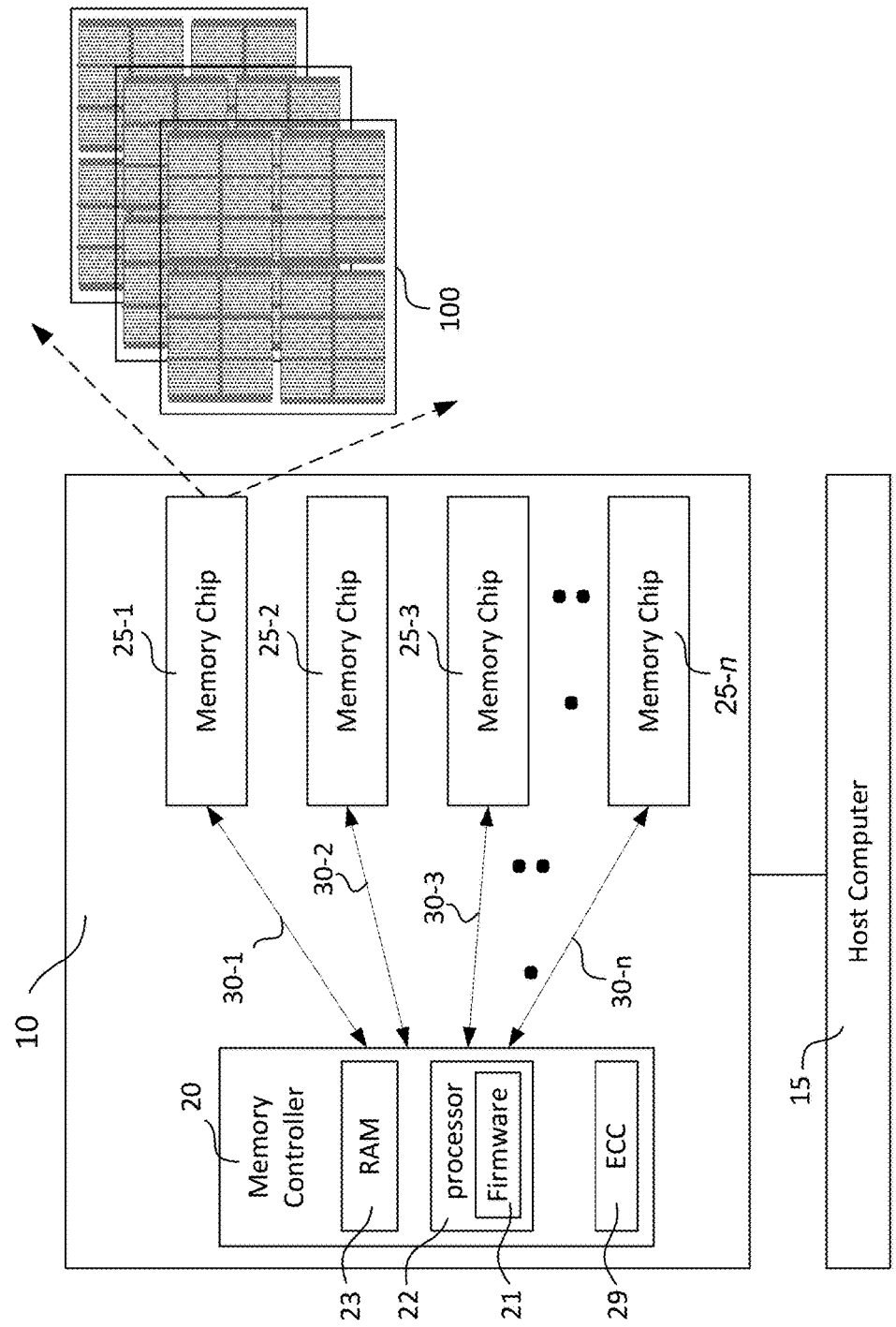
FIGS. 17 and 18A-18B illustrate a storage system with one or more memory chips, according to some embodiments of the present disclosure.

FIG. 17 illustrates a block diagram of an exemplary system Si having a storage system 10, according to some embodiments of the present disclosure. System Si can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. The storage system 10 (also referred to as a NAND storage system) can include a memory controller 20 and one or more semiconductor memory chips 25-1, 25-2, 25-3, . . . , 25-n. Each semiconductor memory chip 25 (hereafter just "memory chip") can be a NAND chip (i.e., "flash," "NAND flash" or "NAND"). The storage system 10 can communicate with a host computer 15 through the memory controller 20, where the memory controller 20 can be connected to the one or more memory chips 25-1, 25-2, 25-3, . . . , 25-n, via one or more memory channels 30-1, 30-2, 30-3, . . . , 30-n. In some embodiments, each memory chip 25 can be managed by the memory controller 20 via a memory channel 30.

In some embodiments, the host computer 15 can include a processor of an electronic device, such as a central processing unit (CPU), or a system-on-chip (SoC), such as an application processor (AP). The host computer 15 sends data to be stored at the NAND storage system or storage system 10 or retrieves data by reading the storage system 10.

The memory controller 20 can handle I/O requests received from the host computer 15, ensure data integrity and efficient storage, and manage the memory chip 25. To perform these tasks, the controller runs firmware 21, which can be executed by one or more processors 22 (e.g., microcontroller units, CPU) inside the controller 20. For example, the controller 20 runs firmware 21 to map logical addresses (i.e., address utilized by the host associated with host data) to physical addresses in the memory chip 25 (i.e., actual locations where the data is stored). The controller 20 also runs firmware 21 to manage defective memory blocks in the memory chip 25, where the firmware 21 can remap the logical address to a different physical address, i.e., move the data to a different physical address. The controller 20 can also include one or more memories 23 (e.g., DRAM, SRAM, EPROM, etc.), which can be used to store various metadata used by the firmware 21. In some embodiments, the memory controller 20 can also perform error recovery through an error correction code (ECC) engine 29. ECC is used to detect and correct the raw bit errors that occur within each memory chip 25.

The memory channels 30 can provide data and control communication between the memory controller 20 and each memory chip 25 via a data bus. The memory controller 20 can select one of the memory chip 25 according to a chip enable signal.

In some embodiments, each memory chip 25 in FIG. 17 can include one or more memory dies 100, where each memory die can be the 3D NAND memory 100 as shown in FIGS. 1-3. In some embodiments, each of the one or more memory dies 100 can include the 3D memory device 1600 shown in FIG. 16, which can be fabricated using the method 400 in FIG. 4.

Figure 18A:
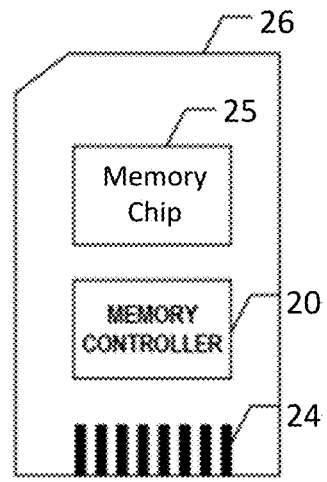
Figure 18B:
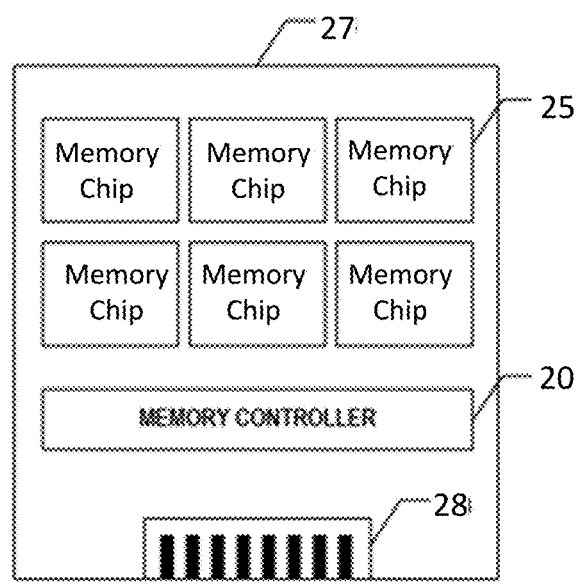

Memory controller 20 and one or more memory chip 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 18A, memory controller 20 and a single memory chip 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, mini SD, microSD, SDHC), a UFS, etc. Memory card 26 can further include a memory card connector 24 coupling memory card 26 with a host (e.g., the host computer 15 in FIG. 17). In another example as shown in FIG. 18B, memory controller 20 and multiple memory chips 25 can be integrated into an solid state drive (SSD) 27. SSD 27 can further include an SSD connector 28 coupling SSD 27 with a host (e.g., the host computer 15 in FIG. 17).

Figure 19:
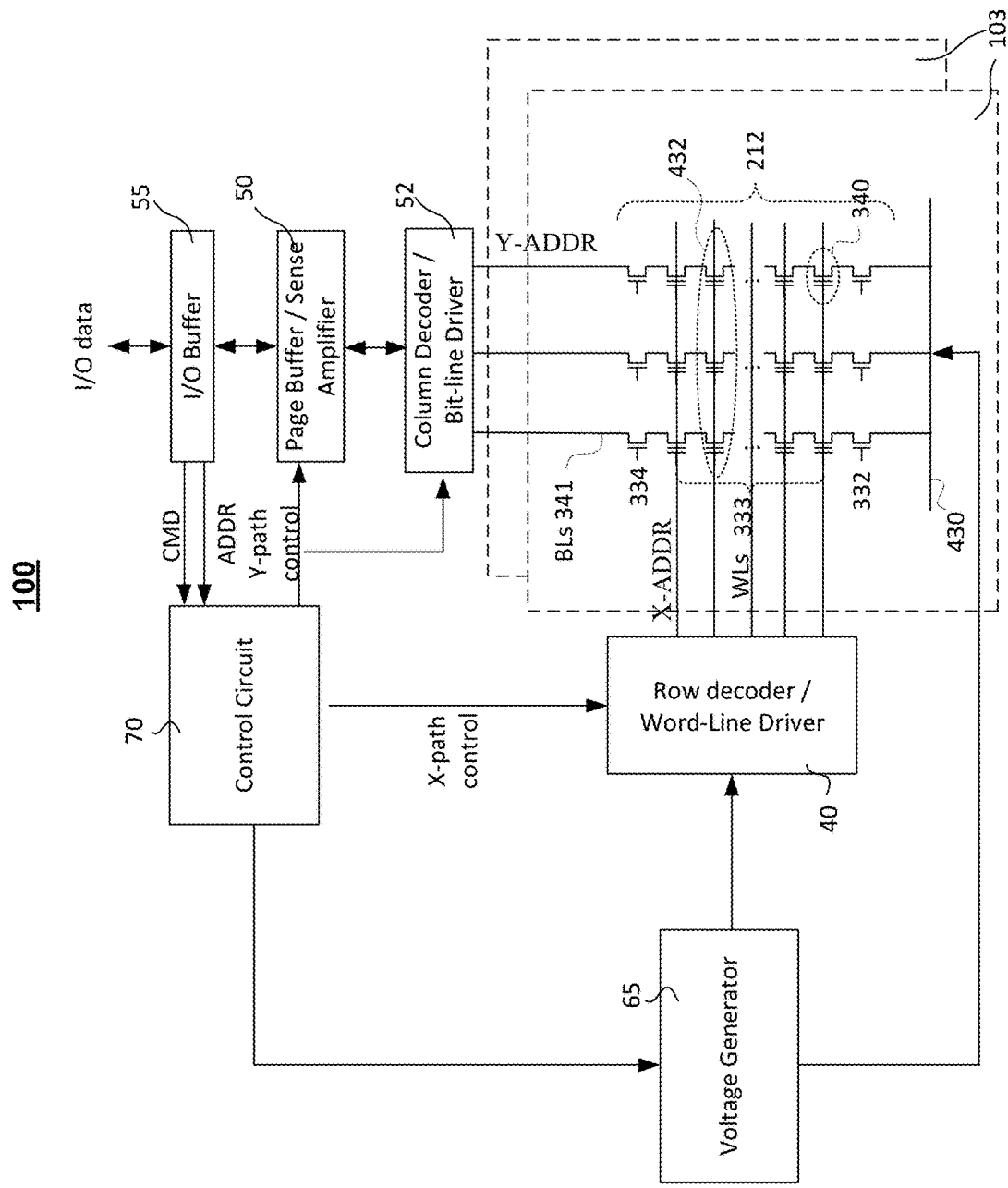
FIG. 19 illustrates a schematic of a three-dimensional (3D) memory die, according to some embodiments of the present disclosure.

FIG. 19 illustrates a schematic diagram of the memory die 100, according to some embodiments of the present disclosure. The memory die 100 includes one or more memory blocks 103 (e.g., 103-1, 103-2, 103-3). Each memory block 103 includes a plurality of memory strings 212. Each memory string 212 includes a plurality of memory cells 340. The memory cells 340 sharing the same word line forms a memory page 432. The memory string 212 can also include at least one field effect transistor (e.g., MOSFET) at each end, which is controlled by a lower select gate (LSG) 332 and a top select gate (TSG) 334, respectively. The drain terminal of the top select transistor 334-T can be connected to the bit line 341, and the source terminal of the lower select transistor 332-T can be connected to an array common source (ACS) 430. The ACS 430 can be shared by the memory strings 212 in an entire memory block, and is also referred to as the common source line.

In some embodiments, the ACS 430 can include the ACS 1280 shown in FIG. 16 and can be fabricated using the method 400 shown in FIG. 4. In this example, the memory die 100 can include the 3D memory device 1600 shown in FIG. 16.

The memory die 100 can also include a periphery circuit that includes many digital, analog, and/or mixed-signal circuits to support functions of the memory block 103, for example, a page buffer/sense amplifier 50, a row decoder/word line driver 40, a column decoder/bit line driver 52, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

The memory blocks 103 can be coupled with the row decoder/word line driver 40 via word lines ("WLs") 333, lower select gates ("LSGs") 332 and top select gates ("TSG") 334. The memory blocks 103 can be coupled with the page buffer/sense amplifier 50 via bit lines ("BLs") 341. The row decoder/word line driver 40 can select one of the memory blocks 103 on the memory die 100 in response to a X-path control signal provided by the control circuit 70. The row decoder/word line driver 40 can transfer voltages provided from the voltage generator 65 to the word lines according to the X-path control signal. During the read and program operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the control circuit 70.

The column decoder/bit line driver 52 can transfer an inhibit voltage $V_{inhibit}$ to an unselected bit line and connect a selected bit line to ground according to a Y-path control signal received from the control circuit 70. In the other words, the column decoder/bit line driver 52 can be configured to select or unselect one or more memory strings 212 according to the Y-path control signal from the control circuit 70. The page buffer/sense amplifier 50 can be configured to read and program (write) data from and to the memory block 103 according to the control signal Y-path control from the control circuit 70. For example, the page buffer/sense amplifier 50 can store one page of data to be programmed into one memory page 432. In another example, page buffer/sense amplifier 50 can perform verify operations to ensure that the data has been properly programmed into each memory cell 340. In yet another example, during a read operation, the page buffer/sense amplifier 50 can sense current flowing through the bit line 341 that reflects the logic state (i.e., data) of the memory cell 340 and amplify small signal to a measurable magnification.

The input/output buffer 55 can transfer the I/O data from/to the page buffer/sense amplifier 50 as well as addresses ADDR or commands CMD to the control circuit 70. In some embodiments, the input/output buffer 55 can function as an interface between the memory controller 20 (in FIG. 1) and the memory die 100 on the memory chip 25.

The control circuit 70 can control the page buffer/sense amplifier 50 and the row decoder/word line driver 40 in response to the commands CMD transferred by the input/output buffer 55. During the program operation, the control circuit 70 can control the row decoder/word line driver 40 and the page buffer/sense amplifier 50 to program a selected memory cell. During the read operation, the control circuit 70 can control the row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify the memory page 432, memory block 103, and memory plane 101 (in FIG. 1), respectively. The column address Y-ADDR can identify a byte or a word in the data of the memory page 432.

The voltage generator 65 can generate voltages to be supplied to word lines and bit lines under the control of the control circuit 70. The voltages generated by the voltage generator 65 include the read voltage $V_{read}$, the program voltage $V_{pgm}$, the pass voltage $V_{pass}$, the inhibit voltage $V_{inhibit}$, etc.

In summary, the present disclosure provides a method for forming a three-dimensional (3D) memory device. The method includes disposing an alternating dielectric stack over a substrate, wherein the alternating dielectric stack comprises first dielectric layers and second dielectric layers alternatingly stacked on the substrate; forming a channel structure penetrating through the alternating dielectric stack and extending into the substrate, wherein the channel structure comprises a channel layer disposed on a sidewall of a memory film; removing the substrate and a portion of the memory film that extends into the substrate to expose a portion of the channel layer; and disposing an array common source (ACS) on the exposed portion of the channel layer.

The present disclosure also provides a three-dimensional (3D) memory device. The 3D memory device includes an array common source (ACS); a film stack of alternating conductive and dielectric layers, comprising conductive layers and first dielectric layers alternatingly stacked on a first side of the ACS; a backside interconnect layer disposed on a second side of the ACS, opposite from the first side, wherein the backside interconnect layer comprises an ACS contact structure; and a memory string penetrating through the film stack. The memory string includes a channel layer having a first portion covered by a memory film; and a second portion in contact with the ACS and electrically connected to the ACS contact structure.

The present disclosure further provides a memory storage system. The memory storage system includes a three-dimensional (3D) NAND memory, where the 3D NAND memory includes an array common source (ACS); and a film stack of alternating conductive and dielectric layers, including conductive layers and first dielectric layers alternatingly stacked on a first side of the ACS. The 3D NAND memory also includes a backside interconnect layer disposed on a second side of the ACS, opposite from the first side, wherein the backside interconnect layer includes an ACS contact structure. The 3D NAND memory further includes a memory string penetrating through the film stack, where the memory string includes a channel layer having a first portion covered by a memory film; and a second portion in contact with the ACS and electrically connected to the ACS contact structure.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    disposing an alternating dielectric stack over a substrate, wherein the alternating dielectric stack includes first dielectric layers and second dielectric layers alternatingly stacked on the substrate;
forming a channel structure penetrating through the alternating dielectric stack and extending into the substrate, wherein the channel structure includes a channel layer disposed on a sidewall of a memory film;
removing the substrate and a portion of the memory film that extends into the substrate to expose a portion of the channel layer;
disposing an array common source (ACS) on the exposed portion of the channel layer;
disposing an ACS contact structure to contact the ACS; and
disposing a through-silicon-via (TSV) contact structure to contact a TSV. wherein an isolation spacer formed on a sidewall of the TSV contact structure extends through the ACS and isolates the TSV and the ACS.

2. The method of claim 1, further comprising including:
disposing a first etch-stop layer on the substrate;
disposing a second etch-stop layer on the first etch-stop layer; and
disposing the alternating dielectric stack on the second etch-stop layer.

3. The method of claim 2, wherein the removing the substrate and the portion of the memory film that extends into the substrate includes:
removing the substrate stopping on the first etch-stop layer to expose the portion of the memory film that extends into the substrate; and
removing the first etch-stop layer and the exposed portion of the memory film stopping on the second etch-stop layer to expose the portion of the channel layer.

4. The method of claim 1, further including forming the ACS contact structure to contact a backside of the ACS, wherein the backside of the ACS is a side farther away from the first dielectric layers.

5. The method of claim 1, further including disposing an insulating layer over the substrate covering the alternating dielectric stack.

6. The method of claim 5, further including forming the TSV in a peripheral region, wherein the TSV penetrates through the insulating layer and extends into the substrate.

7. The method of claim 6, further including forming the TSV contact structure to contact the TSV from a backside of the insulating layer, wherein the backside of the insulating layer is a side farther away from the first dielectric layers.

8. The method of claim 7, wherein the forming the TSV contact structure includes electrically connecting the TSV contact structure with a peripheral device in the peripheral region through the TSV.

9. The method of claim 1, further including forming a staircase structure in the alternating dielectric stack.

10. The method of claim 9, further including:
forming a dummy channel structure penetrating through the staircase structure and extending into the substrate;
removing the substrate to expose a portion of the dummy channel structure that extends into the substrate; and
disposing the ACS on the exposed portion of the dummy channel structure.

11. The method of claim 1, further including:
forming a gate line slit (GLS) opening penetrating through the alternating dielectric stack and extending into the substrate;
replacing the second dielectric layers with conductive layers to form a film stack of alternating conductive and dielectric layers, wherein the film stack includes the conductive layers and the first dielectric layers alternatingly stacked on the substrate; and
disposing a GLS filler inside the GLS opening to form a GLS.

12. The method of claim 11, further including:
removing the substrate to expose a portion of the GLS that extends into the substrate; and
disposing the ACS on the exposed portion of the GLS.

13. A three-dimensional (3D) memory device comprising:
an array common source (ACS);
a film stack of alternating conductive and dielectric layers, including conductive layers and first dielectric layers alternatingly stacked on a first side of the ACS;
a backside interconnect layer disposed on a second side of the ACS, opposite from the first side, wherein the backside interconnect layer includes an ACS contact structure in contact with the ACS and a through-silicon-via (TSV) contact structure in contact with a TSV, wherein an isolation spacer formed on a sidewall of the TSV contact structure and extends through the ACS and isolates the TSV and the ACS; and
a memory string penetrating through the film stack, the memory string comprising: including a channel layer that includes:
a first portion covered by a memory film; and
a second portion in contact with the ACS and electrically connected to the ACS contact structure.

14. The 3D memory device of claim 13, further including an insulating layer disposed on the film stack and the first side of the ACS.

15. The 3D memory device of claim 14, further including the TSV penetrating through the insulating layer, wherein the backside interconnect layer comprises includes the TSV contact structure electrically connected to the TSV.

16. The 3D memory device of claim 15, wherein the TSV contact structure is electrically connected to a peripheral device via the TSV.

17. The 3D memory device of claim 15, wherein the backside interconnect layer further includes an isolation spacing in a staircase region between the TSV contact structure and the ACS contact structure.

18. The 3D memory device of claim 15, further including an interlayer dielectric (ILD) layer, disposed on the second side of the ACS.

19. The 3D memory device of claim 18, wherein the ILD layer further includes a backside deep trench isolation (BDTI) including a dielectric material different from the isolation spacer.

20. The 3D memory device claim 13, wherein the ACS includes a p-type or n-type doped polycrystalline silicon layer.

21. The 3D memory device of claim 13, wherein a first side of the TSV contact structure is below a first side of the ACS contact structure, the first side of the ACS contact structure is in contact with the ACS, and the first side of the TSV contact structure is in contact with the TSV.

22. The 3D memory device of claim 13, wherein the ACS includes a first doped semiconductor layer and a second doped semiconductor layer, and the isolation spacer extends through the first doped semiconductor layer and the second doped semiconductor layer.

23. The 3D memory device of claim 21, wherein a second side of the TSV contact structure includes a groove, the second side of the TSV contact structure is opposite from the first side of the TSV contact structure.

* * * * *